United States Patent
Jeong et al.

(10) Patent No.: US 11,769,742 B2
(45) Date of Patent: *Sep. 26, 2023

(54) SEMICONDUCTOR CHIP AND SEMICONDUCTOR PACKAGE INCLUDING THE SAME

(71) Applicant: Samsung Electronics Co., Ltd., Suwon-si (KR)

(72) Inventors: Eunyoung Jeong, Hwaseong-si (KR); Juik Lee, Anyang-si (KR); Junghoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/747,190

(22) Filed: May 18, 2022

(65) Prior Publication Data

US 2022/0278061 A1    Sep. 1, 2022

Related U.S. Application Data

(63) Continuation of application No. 16/922,828, filed on Jul. 7, 2020, now Pat. No. 11,362,053.

(30) Foreign Application Priority Data

Oct. 30, 2019   (KR) .................. 10-2019-0136943

(51) Int. Cl.
*H01L 23/00* (2006.01)
(52) U.S. Cl.
CPC .... *H01L 24/05* (2013.01); *H01L 2224/05583* (2013.01)

(58) Field of Classification Search
CPC ....... H01L 23/3192; H01L 2224/05578; H01L 24/05; H01L 2224/13021
See application file for complete search history.

(56) References Cited

U.S. PATENT DOCUMENTS

| 5,736,433 A | 4/1998 | Bryant et al. |
| 6,046,101 A | 4/2000 | Dass et al. |

(Continued)

FOREIGN PATENT DOCUMENTS

| JP | 2004273767 A | 9/2004 |
| JP | 2005244028 A | 9/2005 |
| KR | 1019980036834 U | 9/1998 |

OTHER PUBLICATIONS

Office Action dated Jul. 8, 2022 for corresponding DE Patent Application No. 102020115751.7.

*Primary Examiner* — Mamadou L Diallo
(74) *Attorney, Agent, or Firm* — Muir Patent Law, PLLC

(57) ABSTRACT

Disclosed embodiments include a semiconductor chip including a semiconductor substrate having a top surface with a top connection pad disposed therein, and a protection insulation layer comprising an opening therein, the protection insulation layer not covering at least a portion of the top connection pad, on the semiconductor substrate. The protection insulation layer may include: a bottom protection insulation layer, a cover insulation layer comprising a side cover part that covers at least a portion of a side surface of the bottom protection insulation layer and a top cover part disposed apart from the side cover part to cover at least a portion of a top surface of the bottom protection insulation layer. The protection insulation layer may further include a top protection insulation layer on the top cover part.

20 Claims, 17 Drawing Sheets

(56) References Cited

U.S. PATENT DOCUMENTS

| | | | | |
|---|---|---|---|---|
| 6,303,497 B1* | 10/2001 | Lu | ............... | H01L 21/28525 |
| | | | | 257/E21.507 |
| 6,528,881 B1* | 3/2003 | Tsuboi | ............... | H01L 24/03 |
| | | | | 257/781 |
| 6,562,657 B1* | 5/2003 | Lin | ............... | H01L 23/4985 |
| | | | | 438/618 |
| 8,580,672 B2 | 11/2013 | Kuechenmeister et al. | | |
| 8,916,463 B2* | 12/2014 | Daubenspeck | ......... | H01L 24/03 |
| | | | | 257/784 |
| 8,963,266 B2* | 2/2015 | Li | ............... | H01L 27/14618 |
| | | | | 257/431 |
| 10,015,888 B2 | 7/2018 | Chen et al. | | |
| 10,134,702 B2* | 11/2018 | Seo | ............... | H01L 25/0657 |
| 10,892,239 B1* | 1/2021 | Chockalingam | ........ | H01L 24/05 |
| 10,964,653 B2* | 3/2021 | Su | ............... | H01L 24/05 |
| 2002/0055248 A1* | 5/2002 | Liu | ............... | H01L 23/3171 |
| | | | | 216/17 |
| 2008/0105947 A1* | 5/2008 | Kuzuhara | ........... | H01L 23/5283 |
| | | | | 257/E23.141 |
| 2011/0079897 A1 | 4/2011 | Park et al. | | |
| 2011/0209899 A1* | 9/2011 | Hill | ............... | H05K 3/4007 |
| | | | | 29/829 |
| 2011/0304049 A1* | 12/2011 | Shigihara | ................ | H01L 24/48 |
| | | | | 257/782 |
| 2012/0032323 A1* | 2/2012 | Matsumoto | ............. | H01L 24/97 |
| | | | | 257/737 |
| 2014/0124922 A1* | 5/2014 | Kim | ............... | H01L 24/11 |
| | | | | 257/737 |
| 2014/0319695 A1 | 10/2014 | Hsieh et al. | | |
| 2016/0064344 A1* | 3/2016 | Yajima | ................ | H01L 24/09 |
| | | | | 438/653 |
| 2017/0040243 A1* | 2/2017 | Fujii | ............... | H01L 24/08 |
| 2017/0256496 A1* | 9/2017 | Lin | ............... | H01L 24/02 |
| 2018/0374795 A1* | 12/2018 | Deguchi | ................ | H01L 24/03 |
| 2019/0131228 A1* | 5/2019 | Chun | ............... | H01L 24/14 |
| 2019/0164917 A1 | 5/2019 | Huang et al. | | |
| 2019/0295930 A1* | 9/2019 | Deguchi | ................ | H01L 22/32 |
| 2020/0350268 A1* | 11/2020 | Chu | ............... | H01L 24/45 |
| 2021/0210447 A1* | 7/2021 | Wu | ............... | H01L 24/11 |

* cited by examiner

SEMICONDUCTOR CHIP AND SEMICONDUCTOR PACKAGE INCLUDING THE SAME

CROSS-REFERENCE TO RELATED APPLICATION

This application is a continuation of and claims priority to U.S. patent application Ser. No. 16/922,828 filed Jul. 7, 2020, which claims the benefit of Korean Patent Application No. 10-2019-0136943, filed on Oct. 30, 2019, in the Korean Intellectual Property Office, the disclosures of which are incorporated herein in their entirety by reference.

BACKGROUND

The disclosed inventive concepts relate to a semiconductor chip and a semiconductor package including the same, and more particularly, to a semiconductor chip including a connection pad and a semiconductor package including the semiconductor chip.

To meet the need for miniaturized, multifunctional, and high-performance electronic products, semiconductor packages are required to be thin and lightweight and have high speed and performance. Therefore, the demand for semiconductor chips for implementing a system having a high memory bandwidth and semiconductor packages including the semiconductor chips is increasing. Since a memory bandwidth is proportional to a data transfer speed and the number of data transfer lines, a memory bandwidth may be increased by increasing a memory working speed or the number of data transfer lines. Therefore, the number and density of connection bumps attached on connection pads of semiconductor chips are increasing.

SUMMARY

The inventive concept provides a semiconductor chip, including a connection pad for enhancing the reliability of attachment on a connection bump, and a semiconductor package including the semiconductor chip.

The inventive concept provides a semiconductor chip, described below, and a semiconductor package including the semiconductor chip.

According to an aspect of the inventive concept, there is provided a semiconductor chip including a semiconductor substrate having a top surface with a top connection pad disposed therein, and a protection insulation layer comprising an opening therein, the protection insulation layer not covering at least a portion of the top connection pad, on the semiconductor substrate. The protection insulation layer may include: a bottom protection insulation layer, a cover insulation layer comprising a side cover part that covers at least a portion of a side surface of the bottom protection insulation layer and a top cover part disposed apart from the side cover part to cover at least a portion of a top surface of the bottom protection insulation layer. The protection insulation layer may further include a top protection insulation layer on the top cover part.

According to another aspect of the inventive concept, there is provided a semiconductor package including a first semiconductor chip having a first top connection pad and a first bottom connection pad respectively disposed on a top surface and a bottom surface of a first semiconductor substrate, and a first protection insulation layer comprising a first opening therein, the protection insulation layer not covering at least a portion of the first top connection pad on the first semiconductor substrate. The semiconductor package may further include a first through electrode that electrically connects the first top connection pad to the first bottom connection pad, and at least one second semiconductor chip. The second semiconductor chip may include a second top connection pad disposed on a top surface of a second semiconductor substrate, a second protection insulation layer comprising a second opening therein, the second protection insulation layer not covering at least a portion of the second top connection pad on the second semiconductor substrate, and an internal connection terminal disposed on the second top connection pad and electrically connecting the first semiconductor chip to the at least one second semiconductor chip through the first bottom connection pad of the first semiconductor chip, the internal connection terminal contacting a side surface of the second protection insulation layer in the second opening. In some embodiments, the at least one second semiconductor chip is stacked on a bottom surface of the first semiconductor chip. Also in some embodiments, the first protection insulation layer may include a bottom protection insulation layer, a cover insulation layer having a side cover part that covers at least a portion of a side surface of the bottom protection insulation layer and a top cover part disposed apart from the side cover part that covers at least a portion of a top surface of the bottom protection insulation layer, and a top protection insulation layer on the top cover part.

According to another aspect of the inventive concept, there is provided a semiconductor package including a first semiconductor chip having a first top connection pad and a first bottom connection pad respectively disposed on a top surface and a bottom surface of a first semiconductor substrate. The semiconductor chip may include a first barrier layer that covers a portion of a top surface of the first top connection pad, and a first protection insulation layer having a first opening therein, the first protection insulation layer not covering at least a portion of the first top connection pad on the first semiconductor substrate. The semiconductor package may further include a first through electrode that electrically connects the first top connection pad to the first bottom connection pad, and a plurality of second semiconductor chips. The second semiconductor chips may include a second top connection pad and a second bottom connection pad respectively disposed on a top surface and a bottom surface of a second semiconductor substrate, and a second protection insulation layer comprising a second opening therein, the second protection insulation layer not covering at least a portion of the second top connection pad on the second semiconductor substrate, the plurality of second semiconductor chips being stacked on a bottom surface of the first semiconductor chip. The second semiconductor chips may include an internal connection terminal that electrically connects the second top connection pad to the first bottom connection pad or connects second top connection pads and second bottom connection pads of different second conductor chips of the plurality of second semiconductor chips. In some embodiments, the first protection insulation layer includes: a bottom protection insulation layer comprising a protrusion and a step, and the step defines an upper portion of the protrusion adjacent to the opening. The semiconductor package may further include a cover insulation layer having a side cover part that covers at least a portion of a side surface of the bottom protection insulation layer and a top cover part disposed apart from the side cover part to cover at least a portion of a top surface of the bottom protection insulation layer, and a top protection insulation layer on the top cover part.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
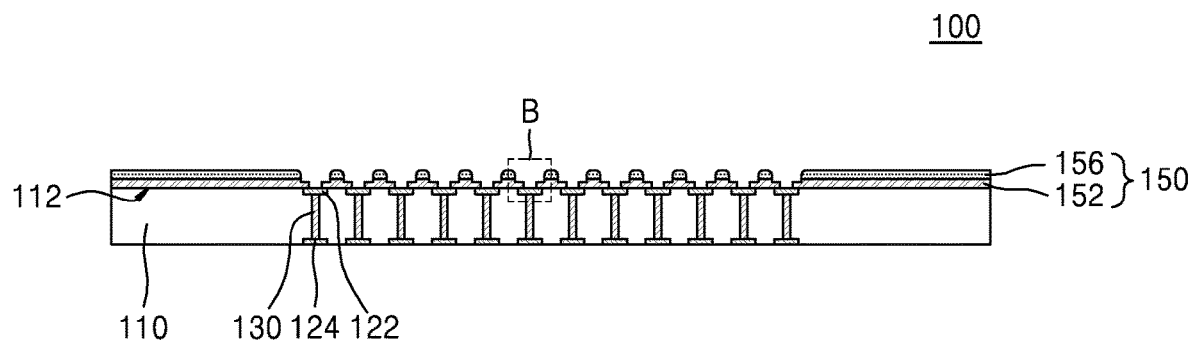
FIG. 1A is a cross-sectional view illustrating a semiconductor chip in accordance with disclosed embodiments.
Figure 1B:
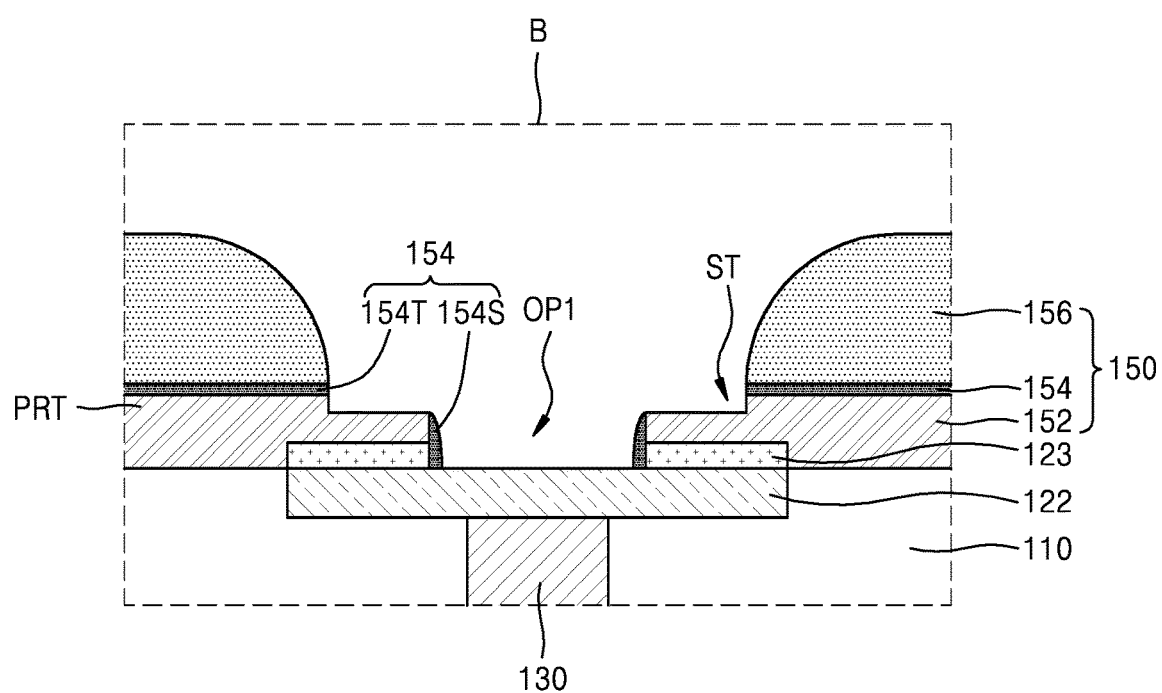
FIG. 1B is a cross-sectional view illustrating a top connection pad of the semiconductor chip in accordance with disclosed embodiments.

FIG. 1A is a cross-sectional view illustrating a semiconductor chip 100 in accordance with disclosed embodiments, and FIG. 1B is a cross-sectional view illustrating a top connection pad of the semiconductor chip 100 in accordance with disclosed embodiments. In detail, FIG. 1B is a cross-sectional view illustrating an enlarged region B of FIG. 1A.

Referring to FIGS. 1A and 1B, the semiconductor chip 100 may include a semiconductor substrate 110 and a top connection pad 122 disposed on an active surface, which is a top surface of the semiconductor substrate 110.

The semiconductor substrate 110 may include a base substrate on which various conductive layers and insulating layers are formed and patterned. The base substrate may be cut from a portion of a wafer and may be, for example, a crystalline semiconductor material such as silicon (Si). Alternatively, the base substrate of the semiconductor substrate 110 may be formed of another crystalline semiconductor material, such as germanium (Ge), and/or may include a compound crystalline semiconductor material such as silicon carbide (SiC), gallium arsenide (GaAs), indium arsenide (InAs), or indium phosphide (InP). The semiconductor substrate 110 may include the active surface and an inactive surface opposite to the active surface, e.g., a bottom surface of the semiconductor substrate 110. The base substrate of the semiconductor substrate 110 may include one or more conductive regions (for example, impurity-doped wells) and various isolation structures such as a shallow trench isolation (STI) structures, for example, to separate/isolate various conductive regions from one another.

In the specification, a top surface and a bottom surface of a semiconductor substrate may respectively denote an active surface and an inactive surface of the semiconductor substrate. That is, even when the active surface of the semiconductor substrate is disposed under the inactive surface in a final product (i.e., the active surface is oriented to face down in the real world), the active surface of the semiconductor substrate is considered as the top surface of the semiconductor substrate, and the inactive surface of the semiconductor substrate is considered as the bottom surface of the semiconductor substrate. Also, the terms "top surface" and "bottom surface" may be respectively applied to an element disposed on the active surface and an element disposed on the inactive surface, respectively.

A semiconductor device 112 may be formed on and within the active surface of the semiconductor substrate 110, the semiconductor device 112 formed as an integrated circuit and as a combination of a plurality of individual electronic elements, such as transistors, logic gates, etc. The semiconductor device 112 may be referred to as a first semiconductor device. The plurality of individual electronic components may include various microelectronic devices (for example, metal-oxide-semiconductor field effect transistors (MOSFETs) such as complementary metal-insulator-semiconductor (CMOS) transistors, image sensors such as system large scale integration (LSI) and CMOS imaging sensors (CISs), micro-electro-mechanical system (MEMS), active devices, and passive devices). The plurality of individual electronic components may be electrically connected to and/or formed with portions of the conductive region of the semiconductor substrate 110. The semiconductor device 112 may be formed as a combination of the plurality of individual electronic components connected together with conductive wiring (which may include conductive plug(s)). Also, the individual electronic components may be electrically isolated from other individual electronic components adjacent thereto by an insulation layer.

The semiconductor chip 100 may be, for example, a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip. The semiconductor chip 100 may be, for example, a central processing unit (CPU) chip, a graphics processing unit (GPU) chip, or an application processor (AP) chip.

In some embodiments, the semiconductor chip 100 may be a high bandwidth memory (HBM) DRAM semiconductor chip. In some embodiments, the semiconductor chip 100 may be a buffer chip including a serial-parallel conversion circuit. In some embodiments, the semiconductor chip 100 may be a buffer chip for controlling an HBM DRAM semiconductor chip. When the semiconductor chip 100 is a buffer chip for controlling an HBM DRAM semiconductor chip, the semiconductor chip 100 may be referred to as a master chip, and the HBM DRAM semiconductor chip may be referred to as a slave chip. Alternatively, the semiconductor chip 100 may be referred to as a first semiconductor chip.

In FIGS. 1A and 1B, the top connection pad 122 is illustrated as being buried into the semiconductor substrate 110, but is not limited thereto. In some embodiments, the top connection pad 122 may protrude from the top surface of the semiconductor substrate 110.

In the specification, the semiconductor substrate 110 may include the base substrate formed of a crystalline semiconductor material (e.g., bulk crystalline Si, Silicon-on-Insulator, etc.), as well as various conductive material layers and insulating material layers which are formed on this base substrate to form the semiconductor device 112. That is, the semiconductor substrate 110 may merely denote that a main component thereof includes a semiconductor material (such as including a base semiconductor substrate as described herein) and does not require that the semiconductor substrate 110 is formed only a semiconductor material.

A protection insulation layer 150 exposing the top connection pad 122 and covering the top surface of the semiconductor substrate 110 may be disposed on the top surface of the semiconductor substrate 110. The protection insulation layer 150 may include a bottom protection insulation layer 152, a cover insulation layer 154, and a top protection insulation layer 156. For ease of illustration and convenience of description, the cover insulation layer 154 is not illustrated in FIGS. 1A and 1s illustrated in detail in FIG. 1B. For example, the bottom protection insulation layer 152 may include an inorganic material such as oxide or nitride. For example, the bottom protection insulation layer 152 may include at least one of silicon oxide and silicon nitride. In some embodiments, the bottom protection insulation layer 152 may include silicon nitride. For example, the cover insulation layer 154 may include silicon nitride. For example, the top protection insulation layer 156 may be and/or include photosensitive polyimide (PSPI). The protection insulation layer 150 may be referred to as a first protection insulation layer.

The semiconductor chip 100 may include a through electrode 130 which electrically connects the top connection pad 122 to the bottom connection pad 124, disposed on the inactive surface, which may be a bottom surface of the semiconductor substrate 110, and passes through at least a portion of the semiconductor substrate 110 between the top surface and the bottom surface of the semiconductor substrate 110. The through electrode 130 may be referred to as a first through electrode. The top connection pad 122 may be referred to as a first top connection pad. The bottom connection pad 124 may be referred to as a first bottom connection pad.

The through electrode 130 may include a conductive plug passing through the semiconductor substrate 110 and a conductive barrier layer surrounding the conductive plug. The conductive plug may have a circular pillar shape, and the conductive barrier layer may have a cylindrical shape surrounding a sidewall of the conductive plug. A via insulation layer may be disposed between the semiconductor substrate 110 and the through electrode 130 and may surround the sidewall of the conductive electrode 130.

In FIG. 1A, the through electrode 130 is illustrated as directly connecting the top connection pad 122 to the bottom connection pad 124, but is not limited thereto and may be formed to have one of a via-first structure, a via-middle structure, and a via-last structure.

In some embodiments, a barrier layer 123 may be formed at a portion of the top connection pad 122. The barrier layer 123 may be disposed between the top connection pad 122 and the bottom protection insulation layer 152. The barrier layer 123 may include, for example, at least one material selected from among titanium (Ti), titanium nitride (TiN), tantalum (Ta), and tantalum nitride (TaN), but is not limited thereto. In FIG. 1B, it is illustrated that the top connection pad 122 is buried into the semiconductor substrate 11 and the barrier layer 123 protrudes from the top surface of the semiconductor substrate 110, but exemplary embodiments are not limited thereto. In some embodiments, the top connection pad 122 and the barrier layer 123 may both be buried into the semiconductor substrate 110. In some other embodiments, the top connection pad 122 and the barrier layer 123 may protrude from the top surface of the semiconductor substrate 110. The barrier layer 123 may be referred to as a first barrier layer. In some embodiments, the barrier layer 123 may be omitted.

The protection insulation layer 150 may include the bottom protection insulation layer 152, the cover insulation layer 154, and the top protection insulation layer 156. The bottom protection insulation layer 152 may include an opening OP1, which exposes at least a portion of the top connection pad 122. In some embodiments, a sidewall of the opening OP1 may extend in a vertical direction with respect to a main surface of the semiconductor substrate 110. For example, the sidewall of the opening OP1 may extend in a perpendicular direction (vertically) with respect to the upper surface of the substrate 110. The bottom protection insulation layer 152 may include a step ST, which is provided at a portion thereof adjacent to the opening OP1 and includes a relatively low top surface. A bottom surface (i.e., a portion of the bottom protection insulation layer 152 having a level higher than that of a relatively low top surface of the bottom protection insulation layer 152) of the step ST may be referred to as a protrusion PRT. The relatively low top surface and a relatively high top surface of the bottom protection insulation layer 152 may respectively denote a bottom surface of the step ST and a top surface of the protrusion PRT. That is, the step ST may be disposed at an upper portion of the opening OP1 to limit the protrusion PRT. The top protection insulation layer 156 may be disposed on the protrusion PRT. For example, in the step ST region, the bottom protection insulation layer 152 may have a top surface that is relatively lower in elevation/height than the top surface of the bottom protection insulation layer 152 in the protrusion PRT region. Similarly, in the step ST region, the bottom protection insulation layer 152 may have a bottom surface that is relatively higher in elevation/height than the bottom surface of the bottom protection insulation layer 152 in protrusion PRT region.

In some embodiments, when the semiconductor chip 100 includes the barrier layer 123, the opening OP1 may pass through the bottom protection insulation layer 152 and the barrier layer 123 to expose a portion of a top surface of the top connection pad 122. The opening OP1 may be referred to as a first opening. At least a portion of the barrier layer 123 may be disposed between the top connection pad 122 and the bottom protection insulation layer 152.

The cover insulation layer 154 may cover a portion of the bottom protection insulation layer 152. In some embodiments, the cover insulation layer 154 may cover a portion of each of a side surface and the top surface of the bottom protection insulation layer 152. The cover insulation layer 154 may include a side cover part 154S covering a portion of the side surface of the bottom protection insulation layer 152 and a top cover part 154T covering a portion (i.e., the top surface of the protrusion PRT) of the top surface of the bottom protection insulation layer 152.

The side cover part 154S may cover at least a portion of a side surface of the barrier layer 123 and at least a portion of the side surface of the bottom protection insulation layer 152 in the opening OP1. In some embodiments, the side cover part 154S may cover a portion of the side surface of the barrier layer 123 and a portion of the side surface of the bottom protection insulation layer 152 in the opening OP1, namely, between the step ST and the top surface of the top connection pad 122. In some embodiments, a bottom surface of the side cover part 154S may contact a portion of the top surface of the top connection pad 122. An uppermost end of the side cover part 154S may be disposed at the same level (elevation/height) as the bottom surface of the step ST, or may be disposed at a level which is lower than the bottom surface of the step ST.

The top cover part 154T may be disposed between the bottom protection insulation layer 152 and the top protection insulation layer 156. The top cover part 154T may be disposed between the top surface of the protrusion PRT of the bottom protection insulation layer 152 and a bottom surface of the top protection insulation layer 156. The top cover part 154T may cover only a portion of the top surface of the bottom protection insulation layer 152 (for example, the top surface (i.e., a relatively high top surface) of the protrusion PRT of the bottom protection insulation layer 152). Additionally, the top cover part 154T may not cover a top surface of the bottom protection insulation layer 152 in the step ST region. The top cover part 154T may cover the whole bottom surface of the top protection insulation layer 156. Although described below with reference to FIGS. 2A to 2D, the cover insulation layer 154 may be formed to cover all of the top surface and the side surface of the bottom protection insulation layer 152 and a portion of the top surface of the top connection pad 122 exposed by a bottom surface of the opening OP1, and then, may be formed by removing a portion thereof covering at least a portion of the top surface of the top connection pad 122 and a portion thereof covering a portion of the top surface of the bottom protection insulation layer 152. In a process of removing a portion of the cover insulation layer 154 covering a portion of the top surface of the bottom protection insulation layer 152, a portion of an upper portion of the bottom protection insulation layer 152 may also be removed together, and thus, the step ST and the protrusion PRT may be formed at the bottom protection insulation layer 152. Therefore, the cover insulation layer 154 may not cover a surface of the bottom protection insulation layer 152 in the region corresponding to the step ST.

FIGS. 2A to 2D are cross-sectional views sequentially illustrating a method of manufacturing a semiconductor chip including a top connection pad, according to disclosed example embodiments. In detail, FIGS. 2A to 2D are cross-sectional views illustrating an enlarged region corresponding to the region B of FIG. 1A.

Figure 2A:
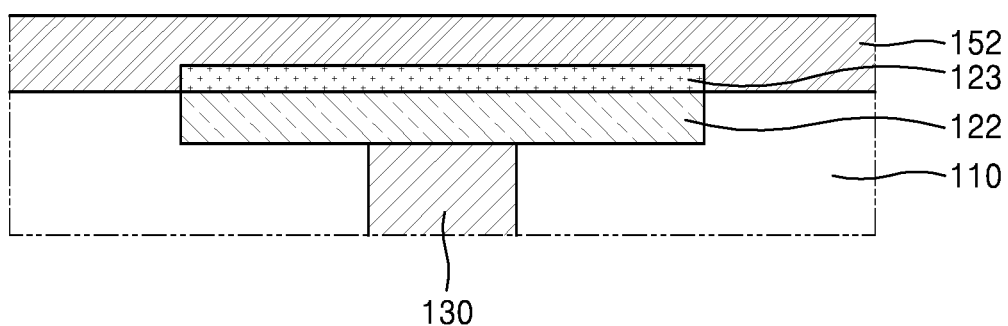
FIGS. 2A to 2D are cross-sectional views sequentially illustrating a method of manufacturing a semiconductor chip including a top connection pad, in accordance with disclosed embodiments.

Referring to FIG. 2A, a top connection pad 122 may be formed in a top surface of a semiconductor substrate 110. The top connection pad 122 may include an electrical conductive material. In some embodiments, the top connection pad 122 may include aluminum (Al). A barrier layer 123 may be formed on the top connection pad 122. The barrier layer 123 may include, for example, at least one material selected from among Ti, TiN, Ta, and TaN. In some embodiments, the barrier layer 123 may include TiN. In some other embodiments, the barrier layer 123 may be omitted.

A through electrode 130 may be formed in the semiconductor substrate 110 and be electrically connected to the top connection pad 122. The through electrode 130 may contact a bottom surface of the top connection pad 122, but is not limited thereto. In some embodiments, a wiring pattern and a wiring via may be disposed between the through electrode 130 and the top connection pad 122 and may electrically connect the through electrode 130 to the top connection pad 122.

A bottom protection insulation layer 152 may be formed on the semiconductor substrate 110 and the top connection pad 122. The bottom protection insulation layer 152 may be formed by, for example, a plasma enhanced chemical vapor deposition (PECVD) process. The bottom protection insulation layer 152 may cover the semiconductor substrate 110 and the top connection pad 122. In embodiments where the barrier layer 123 is formed on the top connection pad 122, the bottom protection insulation layer 152 may cover the semiconductor substrate 110 and the barrier layer 123. For example, the bottom protection insulation layer 152 may include an inorganic material such as oxide or nitride. In some embodiments, the bottom protection insulation layer 152 may include silicon nitride.

Figure 2B:
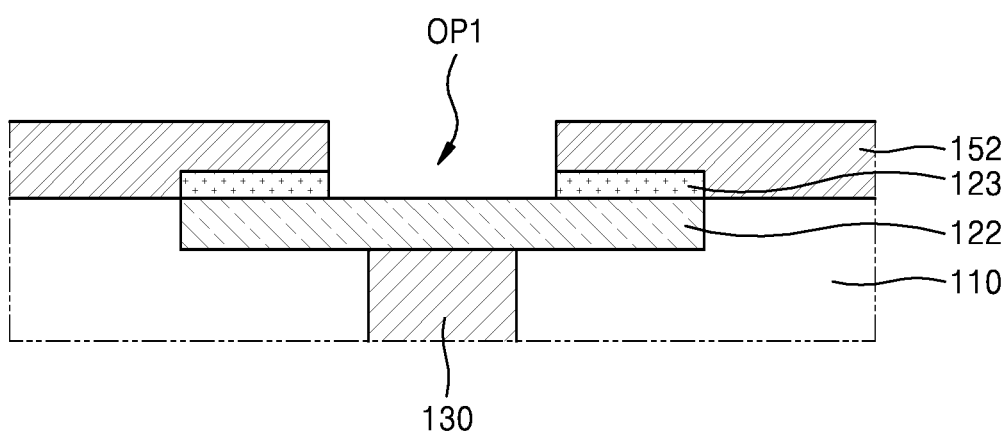

Referring to FIG. 2B, an opening OP1 exposing at least a portion of the top connection pad 122 may be formed by removing a portion of the bottom protection insulation layer 152 that is above the top connection pad 122. In a case where the barrier layer 123 is formed on the top connection pad 122, the opening OP1 may pass through the bottom protection insulation layer 152 and the barrier layer 123, and thus, a portion of a top surface of the top connection pad 122 may be exposed at the bottom surface of the opening OP1. In some embodiments, the opening OP1 may be formed so that a sidewall thereof extends in a vertical direction with respect to a main surface of the semiconductor substrate 110. The opening OP1 may be formed by removing a portion of the bottom protection insulation layer 152 or a portion of each of the bottom protection insulation layer 152 and the barrier layer 123 on the basis of a high density plasma (HDP) etch process, for example.

Figure 2C:
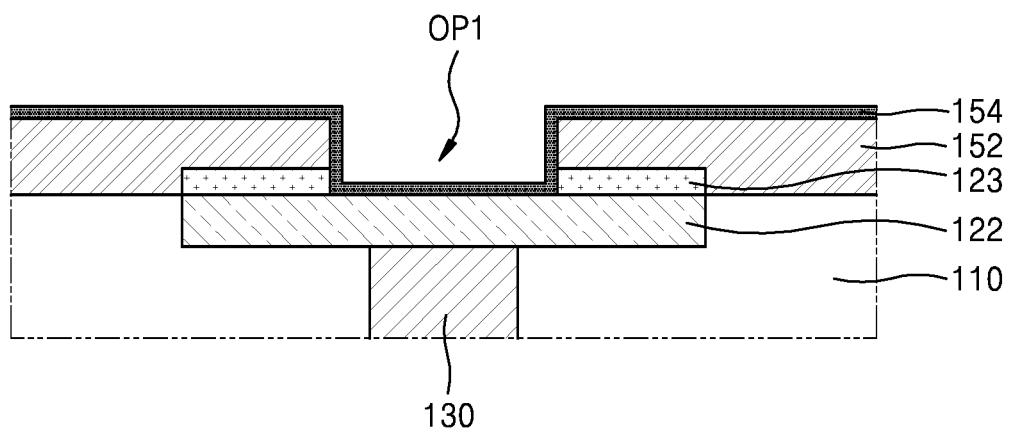

Referring to FIG. 2C, a cover insulation layer 154 may be formed on a resultant material where the opening OP1 is formed. The cover insulation layer 154 may be formed to conformally cover, by a substantially certain thickness, the sidewall and the bottom surface of the opening OP1, namely, a portion of a side surface of each of the bottom protection insulation layer 152 and the barrier layer 123, a portion of the top surface of the top connection pad 122, and a top surface of the bottom protection insulation layer 152. The cover insulation layer 154 may include the same material as that of the bottom protection insulation layer 152. For example, the cover insulation layer 154 may include silicon nitride.

Figure 2D:
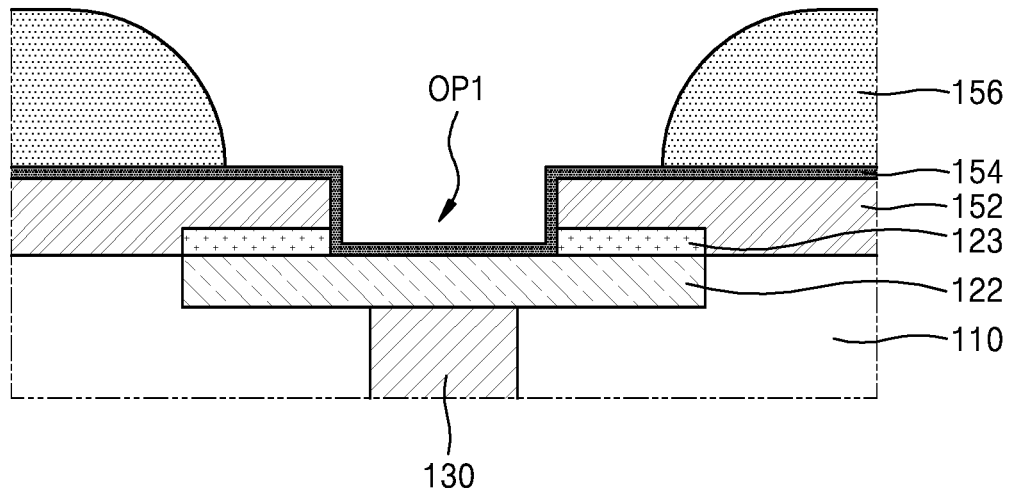

Referring to FIG. 2D, a top protection insulation layer 156 covering a portion of the cover insulation layer 154 may be formed. The top protection insulation layer 156 may include a polymer. For example, the top protection insulation layer 156 may include photosensitive polyimide (PSPI).

The top protection insulation layer 156 may be formed apart from the opening OP1. For example, an edge of top protection insulation layer 156 may be spaced apart from an edge of the opening OP1. The top protection insulation layer 156 may be formed not to cover an inner portion of the opening OP1 and a portion of the cover insulation layer 154 adjacent to the opening OP1. The top protection insulation layer 156 may be formed so that a width of a portion, of the cover insulation layer 154 where the top protection insulation layer 156 is not provided, has a value which is greater than that of a width of the opening OP1.

Referring to FIGS. 1A, 1B, and 2D, a portion of the cover insulation layer 154 and a portion of an upper portion of the bottom protection insulation layer 154 may be removed by using the top protection insulation layer 156 as an etch mask.

A portion of the cover insulation layer 154 and a portion of an upper portion of the bottom protection insulation layer 152 may be removed by an anisotropic etch process. A portion of the cover insulation layer 154 may be removed, and thus, the cover insulation layer 154 may include a side cover part 154S and a top cover part 154T, which are apart from each other. A portion of the bottom protection insulation layer 152 may be removed, and thus, the bottom protection insulation layer 152 may include a step ST and a protrusion PRT.

A portion uncovered by the top protection insulation layer 156 and a portion of the cover insulation layer 154 on the top connection pad 122 in a portion of the cover insulation layer 154 covering a top surface of the bottom protection insulation layer 152 may be removed, a portion of the cover insulation layer 154 disposed between the top protection insulation layer 156 and the bottom protection insulation layer 152 may remain as the top cover part 154T, and a portion of the cover insulation layer 154 on a side surface and the bottom protection insulation layer 152 and the side surface of the barrier layer 123 in the opening OP1 may remain as the side cover part 154S, which is for example a spacer type.

In a process of removing a portion of the cover insulation layer 154, over-etching may be performed to expose a portion of the top surface of the top connection pad 122. Therefore, a portion of an upper portion of the bottom protection insulation layer 154 uncovered by the top protection insulation layer 156 may be removed, and thus, the step ST may be formed. Also, a portion of an upper portion of the bottom protection insulation layer 154 covered by the top protection insulation layer 156 may not be removed, and thus, the protrusion PRT may be formed.

Referring to FIGS. 1A to 2D, as illustrated in FIG. 2D, in a process of forming the top protection insulation layer 156, the top connection pad 122 may be covered by the cover insulation layer 154 and may be maintained in an unexposed state.

For example, by developing PSPI for forming the top protection insulation layer 156 in a state where the top surface of the top connection pad 122 is exposed, discoloration may occur to the top surface of the top connection pad 122 due to a developer. Such discoloration may be a problem with some conventional processes.

In a semiconductor chip 100 in accordance with disclosed embodiments, the top protection insulation layer 156 may be formed in a state where the top connection pad 122 is covered by the cover insulation layer 154 and is not exposed, and thus, discoloration may not occur to the top surface of the top connection pad 122. Therefore, in a process of forming a connection terminal (140 of FIG. 6A) at the top surface of the top connection pad 122, the connection terminal 140 may be attached on the top surface of the top connection pad 122 with accuracy, and thus, the connection reliability of the connection terminal 140 and the top connection pad 122 may be enhanced.

Figure 3:
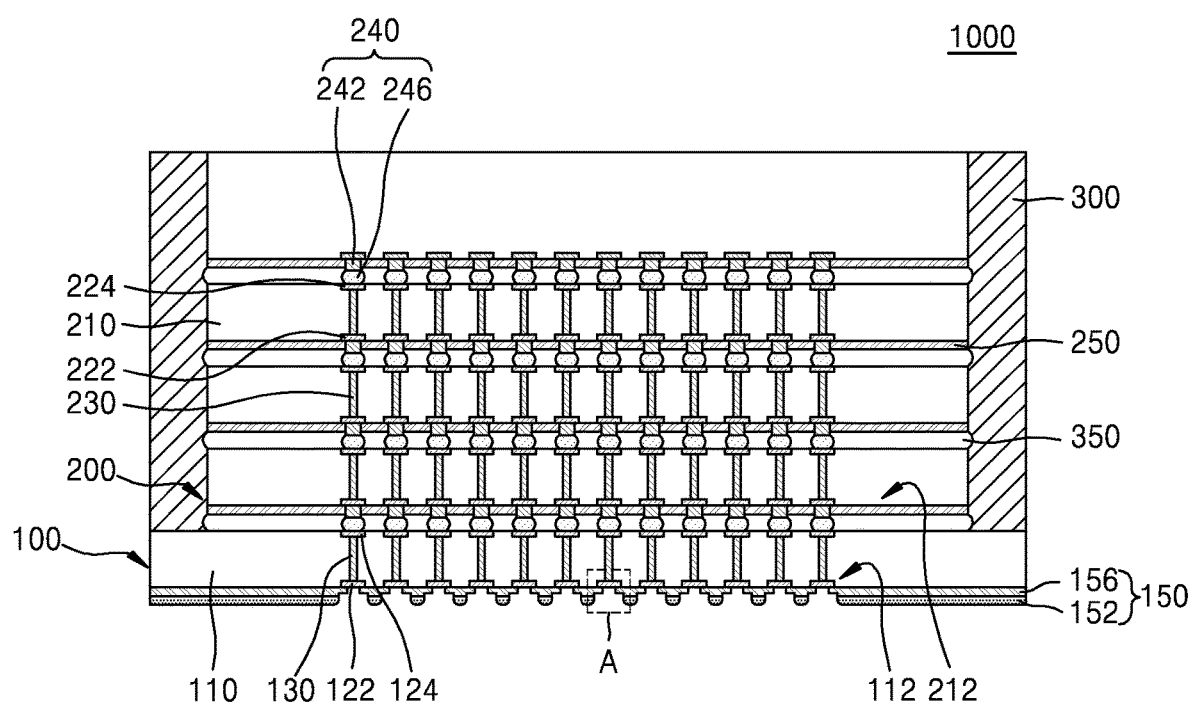
FIG. 3 is a cross-sectional view illustrating a semiconductor package in accordance with disclosed embodiments.

FIG. 3 is a cross-sectional view illustrating a semiconductor package 1000 in accordance with disclosed embodiments.

Referring to FIG. 3, the semiconductor package 1000 may include a first semiconductor chip 100 and a plurality of second semiconductor chips 200. In FIG. 3, the semiconductor package 1000 is illustrated as including four second semiconductor chips 200, but is not limited thereto. For example, the semiconductor package 1000 may include two or more second semiconductor chips 200. In some embodiments, the semiconductor package 1000 may include a multiple of four (4×) second semiconductor chips 200, e.g., eight, twelve, sixteen, etc. The semiconductor package 1000 may be referred to as a sub-semiconductor package. The plurality of second semiconductor chips 200 may be sequentially stacked on the first semiconductor chip 100 in a vertical direction. Each of the first semiconductor chip 100 and the plurality of second semiconductor chips 200 may be sequentially stacked so that an active surface thereof is toward a lower portion thereof.

The first semiconductor chip 100 may include a first semiconductor substrate 110 where a first semiconductor device 112 is formed on an active surface thereof, a first top connection pad 122 and a first bottom connection pad 124 respectively disposed on the active surface and an inactive surface of the first semiconductor substrate 110, a first through electrode 130 passing through at least a portion of the first semiconductor substrate 110 to electrically connect the first top connection pad 122 to the first bottom connection pad 124, and a first protection insulation layer 150 exposing at least a portion of the first top connection pad 122 and covering the active surface of the first semiconductor substrate 110.

In some embodiments, the first semiconductor chip 100 may be an HBM DRAM semiconductor chip. In some embodiments, the first semiconductor chip 100 may be a buffer chip including a serial-parallel conversion circuit. In some embodiments, the first semiconductor chip 100 may be a buffer chip for controlling an HBM DRAM semiconductor chip.

Except for that the active surface is disposed at a lower portion and the inactive surface is disposed at an upper portion, the first semiconductor chip 100 illustrated in FIG. 3 may be the same as the semiconductor chip 100 illustrated in FIG. 1A, and thus, descriptions which are the same as or similar to the descriptions of FIGS. 1A to 2D may be omitted. That is, the first semiconductor chip 100 included in the semiconductor package 1000 may be a semiconductor chip where an upper portion and a lower portion of the semiconductor chip 100 illustrated in FIG. 1A are reversed therebetween.

The second semiconductor chip 200 may include a second semiconductor substrate 210 where a second semiconductor device 212 is formed on an active surface thereof, a second top connection pad 222 and a second bottom connection pad 224 respectively disposed on the active surface and an inactive surface of the second semiconductor substrate 210, a second through electrode 230 passing through at least a portion of the second semiconductor substrate 210 to electrically connect the second top connection pad 222 to the second bottom connection pad 224, and a second protection insulation layer 250 exposing at least a portion of the second top connection pad 222 and covering the active surface of the second semiconductor substrate 210. The second protection insulation layer 250 may include an inorganic material such as oxide or nitride. For example, the second protection insulation layer 250 may include at least one of silicon oxide and silicon nitride. In some embodiments, the second protection insulation layer 250 may include silicon nitride.

The second semiconductor substrate 210, the second top connection pad 222, the second bottom connection pad 224, and the second through electrode 230 may be the same, substantially the same, or similar as the first semiconductor substrate 110, the first top connection pad 122, the first bottom connection pad 124, and the first through electrode 130, respectively, and thus, their repeated detailed descriptions are omitted.

The second semiconductor chip 200 may be, for example, a DRAM chip, an SRAM chip, a flash memory chip, an EEPROM chip, a PRAM chip, an MRAM chip, or an RRAM chip. In some embodiments, the second semiconductor chip 200 may be an HBM DRAM semiconductor chip. The first semiconductor chip 100 may be referred to as a master chip, and the second semiconductor chip 200 may be referred to as a slave chip.

An internal connection terminal 240 may be attached on the second top connection pad 222 of each of the plurality of second semiconductor chips 200. The internal connection terminal 240 may electrically connect the first bottom connection pad 124 of the first semiconductor chip 100 to the second top connection pads 222 of the plurality of second semiconductor chips 200 and may electrically connect the second bottom connection pad 224 and the second top connection pad 222 of each of the plurality of second semiconductor chips 200.

The internal connection terminal 240 may include a base pillar 242 (a conductive pillar) of the second top connection pad 222 and a conductive cap 246 on the base pillar 242. In some embodiments, a cover pillar (244 of FIG. 6B) may be disposed between the base pillar 242 and the conductive cap 246. The internal connection terminal 240 may be referred to as a second connection terminal, and the base pillar 242, the cover pillar 244, and the conductive cap 246 may be respectively referred to as a second conductive pillar, a second cover pillar, and a third conductive cap. The internal connection terminal 240 and the second protection insulation layer 250 will be described in detail with reference to FIG. 6B. The connection terminal 140 illustrated in FIG. 6A may be referred to as a first connection terminal, and the internal connection terminal 240 may be referred to as a second connection terminal.

An insulating adhesive layer 350 may be disposed between the first semiconductor chip 100 and each of the plurality of second semiconductor chips 200. The insulating adhesive layer 350 may include a non-conductive film (NFC), a non-conductive paste (NCP), an insulating polymer, or an epoxy resin, for example. The insulating adhesive layer 350 may surround the internal connection terminal 240 and may fill a region between the first semiconductor chip 100 and each of the plurality of second semiconductor chips 200.

In some embodiments, a second semiconductor chip 200 disposed at an uppermost end farthest away from the first semiconductor chip 100 among the plurality of second semiconductor chips 200 may not include the second bottom connection pad 224 and the second through electrode 230. In some embodiments, a thickness of a second semiconductor chip 200 disposed at an uppermost end disposed farthest away from the first semiconductor chip 100 among the plurality of second semiconductor chips 200 may have a value (thickness) which is less than a thickness of each of the other second semiconductor chips 200.

A width and an area of the first semiconductor chip 100 may each have corresponding values which are greater than a corresponding width and a corresponding area of each of the plurality of second semiconductor chips 200. The semiconductor package 1000 may further include a molding layer 300 surrounding side surfaces of the plurality of second semiconductor chips 200 and a side surface of the insulating adhesive layer 350 on the first semiconductor chip 100. The molding layer 300 may include, for example, an epoxy mold compound (EMC).

FIGS. 4A to 4D are cross-sectional views illustrating a connection pad of a semiconductor package in accordance with disclosed embodiments. In detail, FIGS. 4A to 4D are cross-sectional views illustrating an enlarged region corresponding to the region B of FIG. 1A, the same reference numerals as FIGS. 1A and 1B refer to like elements, and repetitive descriptions thereof may be omitted.

Figure 4A:
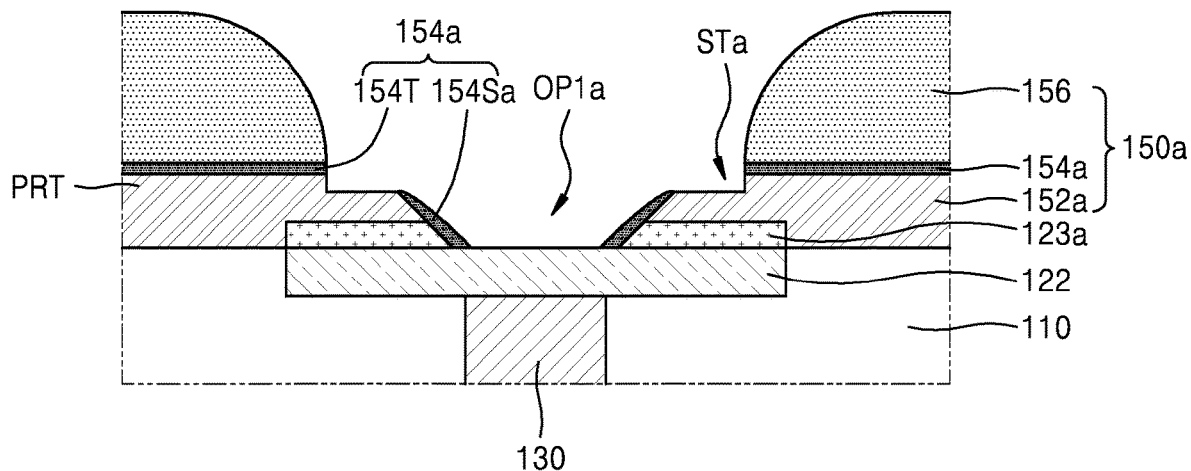
FIGS. 4A to 4D are cross-sectional views illustrating a connection pad of a semiconductor package in accordance with disclosed embodiments.

Referring to FIG. 4A, a protection insulation layer 150a exposing a connection pad 122 and covering a top surface of a semiconductor substrate 110 may be disposed on the top surface of the semiconductor substrate 110. The protection insulation layer 150a may include a bottom protection insulation layer 152a, a cover insulation layer 154a, and a top protection insulation layer 156. For example, the bottom protection insulation layer 152a may include an inorganic material such as oxide or nitride. For example, the bottom protection insulation layer 152a may include at least one of silicon oxide and silicon nitride. In some embodiments, the bottom protection insulation layer 152a may include silicon nitride. For example, the cover insulation layer 154a may include silicon nitride. For example, the top protection insulation layer 156 may include PSPI. The protection insulation layer 150a may be referred to as a first protection insulation layer.

In some embodiments, a barrier layer 123a may be formed at a portion on the connection pad 122. For example, the barrier layer 123a may be formed only at the edge portions of the connection pad 122 and thus leave the center portion of connection pad 122 exposed. The barrier layer 123a may be disposed between the connection pad 122 and the bottom protection insulation layer 152a. In some embodiments, the barrier layer 123a may be omitted.

The protection insulation layer 150a may include the bottom protection insulation layer 152a, the cover insulation layer 154a, and the top protection insulation layer 156. The bottom protection insulation layer 152a may include an opening OP1a, which exposes at least a portion of the connection pad 122. The opening OP1a may have a horizontal width, which increases in a distancing direction (vertical direction) from a bottom surface thereof to an upper portion thereof. For example, the opening OP1a may have a relatively small width in the horizontal direction at a lowermost elevation that corresponds to an elevation of the upper surface of connection pad 122 and an increasing and relatively larger width in the horizontal direction at various elevations there above. The bottom protection insulation layer 152a and the barrier layer 123a may have a combined horizontal width, which decreases from the bottom surface of the opening OP1a to the upper portion of the opening OP1a. That is, side surfaces of the bottom protection insulation layer 152a and the barrier layer 123a immediately adjacent the opening OP1a may be inclined away from the bottom of opening OP1a and may extend upward.

The bottom protection insulation layer 152a may include a step STa including a relatively low top surface at a portion thereof adjacent to the opening OP1a. A bottom surface (i.e., a portion of the bottom protection insulation layer 152a having a level that is higher than that of a relatively low top surface of the bottom protection insulation layer 152a) of the step STa may be referred to as a protrusion PRT. The relatively low top surface and a relatively high top surface of the bottom protection insulation layer 152a may respectively denote a bottom surface of the step STa and a top surface of the protrusion PRT.

The opening OP1a may pass through the bottom protection insulation layer 152a and the barrier layer 123a to expose a portion of a top surface of the connection pad 122. The opening OP1a may be referred to as a first opening.

The cover insulation layer 154a may cover a portion of the bottom protection insulation layer 152a. In some embodiments, the cover insulation layer 154a may cover a portion of each of a side surface and the top surface of the bottom protection insulation layer 152a. The cover insulation layer 154a may include a side cover part 154Sa covering a portion of the side surface of the bottom protection insulation layer 152a and a portion of a side surface of the barrier layer 123a and a top cover part 154T covering a portion (i.e., the top surface of the protrusion PRT) of the top surface of the bottom protection insulation layer 152a.

The side cover part 154Sa may cover at least a portion of the side surface of the barrier layer 123a and at least a portion of the side surface of the bottom protection insulation layer 152a in the opening OP1a. In some embodiments, the side cover part 154Sa may cover all of the side surface of the barrier layer 123a and all of the side surface of the bottom protection insulation layer 152a in the opening OP1a. In some embodiments, the side cover part 154Sa may cover a portion of the side surface of the barrier layer 123a and a portion of the side surface of the bottom protection insulation layer 152a in the opening OP1a, namely, between the step STa and the top surface of the top connection pad 122. In some embodiments, a bottom surface of the side cover part 154Sa may contact a portion of the top surface of the connection pad 122. An uppermost end of the side cover part 154Sa may be disposed at the same level (elevation/height) as the bottom surface of the step STa, or may be disposed at a level (elevation/height) which is lower than the bottom surface of the step STa.

The top cover part 154T may be disposed between the bottom protection insulation layer 152a and the top protection insulation layer 156. The top cover part 154T may be disposed between the top surface of the protrusion PRT of the bottom protection insulation layer 152a and a bottom surface of the top protection insulation layer 156. The top cover part 154T may cover only a portion of the top surface of the bottom protection insulation layer 152a (for example, the top surface (i.e., a relatively high top surface) of the protrusion PRT of the bottom protection insulation layer 152a). Additionally, the top cover part 154T may not cover a top surface of the bottom protection insulation layer 152a in the step STa region. The top cover part 154T may cover the whole bottom surface of the top protection insulation layer 156.

Figure 4B:
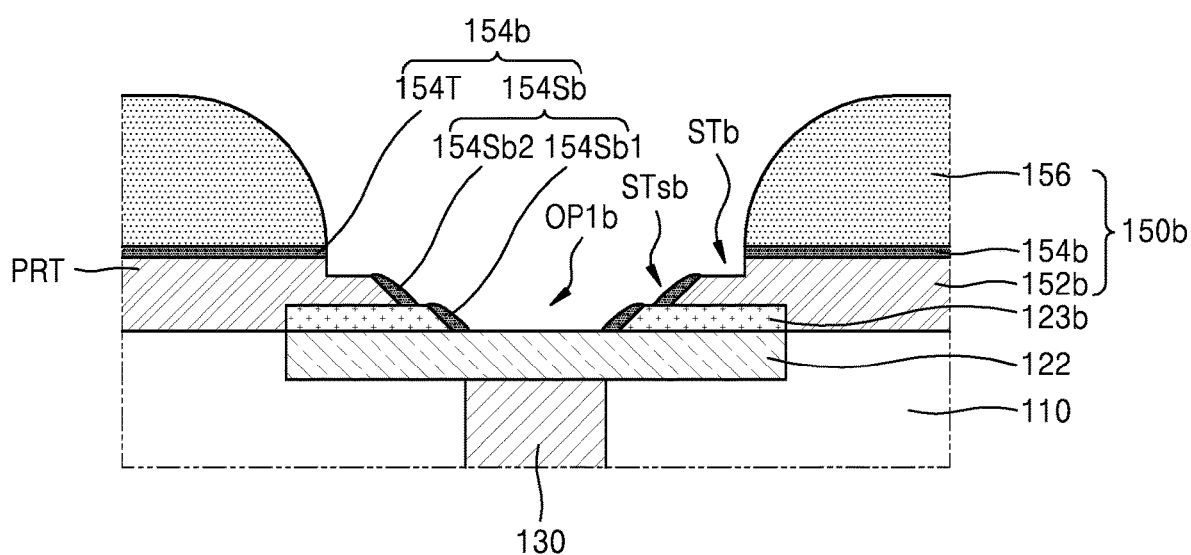

Referring to FIG. 4B, a protection insulation layer 150b exposing a connection pad 122 and covering a top surface of a semiconductor substrate 110 may be disposed on the top surface of the semiconductor substrate 110. The protection insulation layer 150b may include a bottom protection insulation layer 152b, a cover insulation layer 154b, and a top protection insulation layer 156. For example, the bottom protection insulation layer 152b may include silicon nitride. For example, the cover insulation layer 154b may include silicon nitride. The protection insulation layer 150b may be referred to as a first protection insulation layer.

A barrier layer 123b may be formed at a portion on the connection pad 122. For example, the barrier layer 123b may expose a central portion of connection pad 122 and cover at least a portion of the remaining non-exposed area of connection pad 122. The barrier layer 123b may be disposed between the connection pad 122 and the bottom protection insulation layer 152b.

The protection insulation layer 150b may include the bottom protection insulation layer 152b, the cover insulation layer 154b, and the top protection insulation layer 156. The bottom protection insulation layer 152b may include an opening OP1b, which exposes at least a portion of the connection pad 122. The opening OP1b may have a horizontal width, which increases in a distancing direction (vertical direction) from a bottom surface thereof to an upper portion thereof. For example, the opening OP1b may have a relatively small width in the horizontal direction at a lowermost elevation that corresponds to an elevation of the upper surface of connection pad 122 and an increasing and relatively larger width in the horizontal direction at various elevations there above. The bottom protection insulation layer 152b and the barrier layer 123b may have a horizontal width, which decreases in a distancing direction (vertical direction) from the bottom surface of the opening OP1b to the upper portion of the opening OP1b. That is, side surfaces of the bottom protection insulation layer 152b and the barrier layer 123b in the opening OP1b may be inclined away from the bottom of opening OP1b and may extend upward.

The bottom protection insulation layer 152b may include a step STb including a relatively low top surface at a portion thereof adjacent to the opening OP1b. A bottom surface (i.e., a portion of the bottom protection insulation layer 152b having a level that is higher than that of a relatively low top surface of the bottom protection insulation layer 152b) of the step STb may be referred to as a protrusion PRT. The relatively low top surface and a relatively high top surface of the bottom protection insulation layer 152b may respectively denote a bottom surface of the step STb and a top surface of the protrusion PRT.

The opening OP1b may pass through the bottom protection insulation layer 152b and the barrier layer 123b to expose a portion of a top surface of the connection pad 122. The opening OP1b may be referred to as a first opening.

In a process of forming the opening OP1b, due to an etch characteristic difference between the bottom protection insulation layer 152b and the barrier layer 123b, a sub-step STsb may be formed between the bottom protection insulation layer 152b and the barrier layer 123b in the opening OP1b. The sub-step STsb may be defined by a side surface of the bottom protection insulation layer 152b and an exposed top surface of the barrier layer 123b. A width of a portion of the opening OP1b at a level at which the barrier layer 123b is disposed may have a value which is less than that of a width of a portion of the opening OP1b at a level at which the bottom protection insulation layer 152b is disposed.

The cover insulation layer 154b may cover a portion of the bottom protection insulation layer 152b. In some embodiments, the cover insulation layer 154b may cover a portion of each of a side surface and the top surface of the bottom protection insulation layer 152b. The cover insulation layer 154b may include a side cover part 154Sb covering a portion of the side surface of the bottom protection insulation layer 152b and a portion of a side surface of the barrier layer 123b and a top cover part 154T covering a portion (i.e., the top surface of the protrusion PRT) of the top surface of the bottom protection insulation layer 152b.

The side cover part 154Sb may cover each of at least a portion of the side surface of the barrier layer 123b and at least a portion of the side surface of the bottom protection insulation layer 152b in the opening OP1b. In some embodiments, the side cover part 154Sb may include a first side portion 154Sb1 covering a portion of the side surface of the barrier layer 123b and a second side portion 154Sb2 covering a portion of the side surface of the bottom protection insulation layer 152b in the opening OP1b. The first side portion 154Sb1 and the second side portion 154Sb2 may be spaced apart from each other with an exposed portion of the top surface of the barrier layer 123b therebetween. In some embodiments, a bottom surface of the first side portion 154Sb1 may contact a portion of the top surface of the connection pad 122. In some embodiments, a bottom surface of the second side portion 154Sb2 may contact a portion of the top surface of the barrier layer 123b. Each of an uppermost end of the first side portion 154Sb1 and the second side portion 154Sb2 may be disposed at the same level as the bottom surface of each of the sub-step STsb and the step STb, or may be disposed at a level which is lower than the bottom surface of each of the sub-step STsb and the step STb.

The top cover part 154T may be disposed between the bottom protection insulation layer 152b and the top protection insulation layer 156. The top cover part 154T may be disposed between the top surface of the protrusion PRT of the bottom protection insulation layer 152b and a bottom surface of the top protection insulation layer 156. The top cover part 154T may cover only a portion of the top surface of the bottom protection insulation layer 152b (for example, the top surface (i.e., a relatively high top surface) of the protrusion PRT of the bottom protection insulation layer 152b). Additionally, the top cover part 154T may not cover a top surface of the bottom protection insulation layer 152b in the step STb region. The top cover part 154T may cover the whole bottom surface of the top protection insulation layer 156.

Figure 4C:
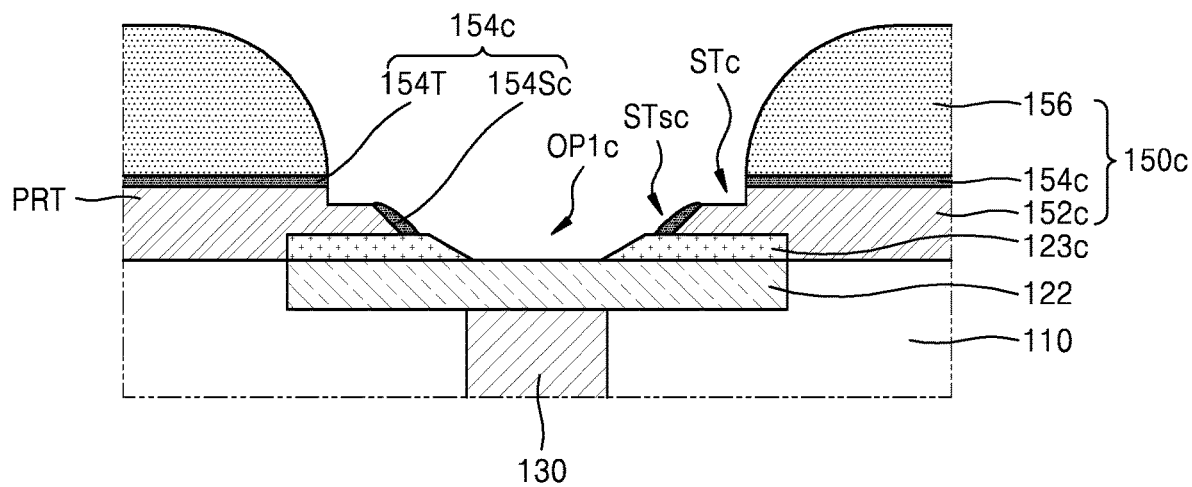

Referring to FIG. 4C, a protection insulation layer 150c exposing a connection pad 122 and covering a top surface of a semiconductor substrate 110 may be disposed on the top surface of the semiconductor substrate 110. The protection insulation layer 150c may include a bottom protection insulation layer 152c, a cover insulation layer 154c, and a top protection insulation layer 156. For example, the bottom protection insulation layer 152c may include silicon nitride. For example, the cover insulation layer 154c may include silicon nitride. The protection insulation layer 150c may be referred to as a first protection insulation layer.

A barrier layer 123c may be formed at a portion on the connection pad 122. For example, the barrier layer 123c may be formed only at the edge portions of the connection pad 122 and thus leave the center portion of connection pad 122 exposed. The barrier layer 123c may be disposed between the connection pad 122 and the bottom protection insulation layer 152c.

The protection insulation layer 150c may include the bottom protection insulation layer 152c, the cover insulation layer 154c, and the top protection insulation layer 156. The bottom protection insulation layer 152c may include an opening OP1c, which exposes at least a portion of the connection pad 122. The opening OP1c may have a horizontal width, which increases in a distancing direction (vertical direction) from a bottom surface thereof to an upper portion thereof. The bottom protection insulation layer 152c and the barrier layer 123c may have a horizontal width, which decreases in a distancing direction (vertical direction) from the bottom surface of the opening OP1c to the upper portion of the opening OP1c. That is, side surfaces of the bottom protection insulation layer 152c and the barrier layer 123c immediately adjacent the opening OP1c may be inclined away from the bottom of opening OP1c and may extend upward.

The bottom protection insulation layer 152c may include a step STc including a relatively low top surface at a portion thereof adjacent to the opening OP1c. A bottom surface (i.e., a portion of the bottom protection insulation layer 152c having a level higher than that of a relatively low top surface of the bottom protection insulation layer 152c) of the step STc may be referred to as a protrusion PRT. The relatively low top surface and a relatively high top surface of the bottom protection insulation layer 152c may respectively denote a bottom surface of the step STc and a top surface of the protrusion PRT.

The opening OP1c may pass through the bottom protection insulation layer 152c and the barrier layer 123c to expose a portion of a top surface of the connection pad 122. The opening OP1c may be referred to as a first opening.

In a process of forming the opening OP1c, due to an etch characteristic difference between the bottom protection insulation layer 152c and the barrier layer 123c, a sub-step STsc may be formed between the bottom protection insulation layer 152c and the barrier layer 123c in the opening OP1c. The sub-step STsc may be defined by a side surface of the bottom protection insulation layer 152c and a top surface of the barrier layer 123c. A width of a portion of the opening OP1c at a level at which the barrier layer 123c is disposed may have a value which is less than that of a width of a portion of the opening OP1c at a level at which the bottom protection insulation layer 152c is disposed.

A side surface of the barrier layer 123c facing the barrier layer 123c in the opening OP1c may be inclined more than a side surface of the bottom protection insulation layer 152c facing the bottom protection insulation layer 152c. That is, an acute angle between the top surface of the barrier layer 123c and the side surface of the bottom protection insulation layer 152c may be greater than an acute angle between a bottom surface of the barrier layer 123c and the side surface of the barrier layer 123c.

The cover insulation layer 154c may cover a portion of the bottom protection insulation layer 152c. In some embodiments, the cover insulation layer 154c may cover a portion of each of the side surface and the top surface of the bottom protection insulation layer 152c. The cover insulation layer 154c may include a side cover part 154Sc covering a portion of the side surface of the bottom protection insulation layer 152c and a top cover part 154T covering a portion (i.e., the top surface of the protrusion PRT) of the top surface of the bottom protection insulation layer 152c.

The side cover part 154Sc may cover at least a portion of the side surface of the bottom protection insulation layer 152c in the opening OP1c. In some embodiments, the side cover part 154Sc may cover at least a portion of the side surface of the bottom protection insulation layer 152c in the opening OP1c, but may not cover the side surface of the barrier layer 123c.

In embodiments where an acute angle between the top surface of the barrier layer 123c and the side surface of the bottom protection insulation layer 152c is greater than an acute angle between the bottom surface of the barrier layer 123c and the side surface of the barrier layer 123c, a portion of the cover insulation layer 154c on the side surface of the bottom protection insulation layer 152c may remain as the side cover part 154Sc, which may be a spacer type, but may not remain on the side surface of the barrier layer 123c.

The side cover part 154Sc may be spaced apart from the connection pad 122. In some embodiments, a bottom surface of the side cover part 154Sc may contact a portion of the top surface of the barrier layer 123c. An uppermost end of the side cover part 154Sc may be disposed at the same level as the bottom surface of the step STc, or may be disposed at a level which is lower than the bottom surface of the step STc.

The top cover part 154T may be disposed between the bottom protection insulation layer 152c and the top protection insulation layer 156. The top cover part 154T may be disposed between the top surface of the protrusion PRT of the bottom protection insulation layer 152c and a bottom surface of the top protection insulation layer 156. The top cover part 154T may cover only a portion of the top surface of the bottom protection insulation layer 152c (for example, the top surface (i.e., a relatively high top surface) of the protrusion PRT of the bottom protection insulation layer 152c). Additionally, the top cover part 154T may not cover a top surface of the bottom protection insulation 152c in the step STc region. The top cover part 154T may cover the whole bottom surface of the top protection insulation layer 156.

Figure 4D:
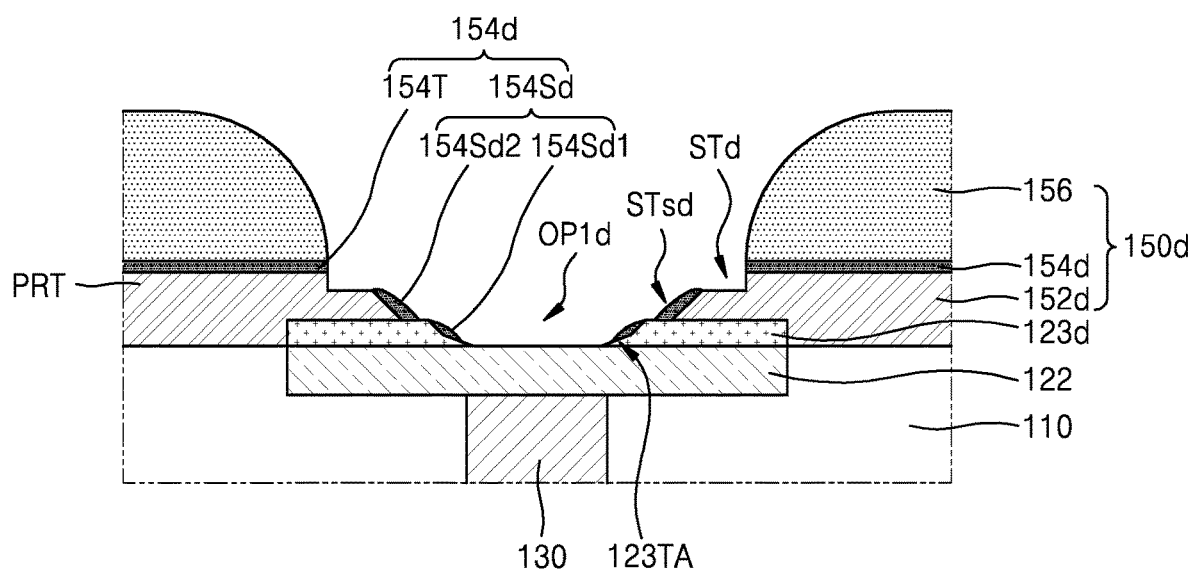

Referring to FIG. 4D, a protection insulation layer 150d exposing a connection pad 122 and covering a top surface of a semiconductor substrate 110 may be disposed on the top surface of the semiconductor substrate 110. The protection insulation layer 150d may include a bottom protection insulation layer 152d, a cover insulation layer 154d, and a top protection insulation layer 156. For example, the bottom protection insulation layer 152d may include silicon nitride. For example, the cover insulation layer 154d may include silicon nitride. The protection insulation layer 150d may be referred to as a first protection insulation layer.

A barrier layer 123d may be formed at a portion on the connection pad 122. For example, the barrier layer 123d may be formed only at the edge portions of the connection pad 122 and thus leave the center portion of connection pad 122 exposed. The barrier layer 123d may be disposed between the connection pad 122 and the bottom protection insulation layer 152d.

The protection insulation layer 150d may include the bottom protection insulation layer 152d, the cover insulation layer 154d, and the top protection insulation layer 156. The bottom protection insulation layer 152d may include an opening OP1d, which exposes at least a portion of the connection pad 122. The opening OP1d may have a horizontal width, which increases in a distancing direction (vertical direction) from a bottom surface thereof to an upper portion thereof. The bottom protection insulation layer 152d and the barrier layer 123d may have a horizontal width, which decreases in a distancing direction (vertical direction) from the bottom surface of the opening OP1d to the upper portion of the opening OP1d. That is, side surfaces of the bottom protection insulation layer 152d and the barrier layer 123d in the opening OP1d may be inclined away from the bottom of opening OP1d and may extend upward.

The bottom protection insulation layer 152d may include a step STd including a relatively low top surface at a portion thereof adjacent to the opening OP1d. A bottom surface (i.e., a portion of the bottom protection insulation layer 152d having a level higher than that of a relatively low top surface of the bottom protection insulation layer 152d) of the step STd may be referred to as a protrusion PRT. The relatively low top surface and a relatively high top surface of the bottom protection insulation layer 152d may respectively denote a bottom surface of the step STd and a top surface of the protrusion PRT.

The opening OP1d may pass through the bottom protection insulation layer 152d and the barrier layer 123d to expose a portion of a top surface of the connection pad 122. The opening OP1d may be referred to as a first opening.

In a process of forming the opening OP1d, due to an etch characteristic difference between the bottom protection insulation layer 152d and the barrier layer 123d, a sub-step STsd may be formed between the bottom protection insulation layer 152d and the barrier layer 123d in the opening OP1d. The sub-step STsd may be defined by a side surface of the bottom protection insulation layer 152d and a top surface of the barrier layer 123d. A width of a portion of the opening OP1d at a level at which the barrier layer 123d is disposed may have a value which is less than that of a width of a portion of the opening OP1d at a level at which the bottom protection insulation layer 152d is disposed at the step STd.

The cover insulation layer 154d may cover a portion of the bottom protection insulation layer 152d. In some embodiments, the cover insulation layer 154d may cover a portion of each of the side surface and the top surface of the bottom protection insulation layer 152d. The cover insulation layer 154d may include a side cover part 154Sd covering a portion of the side surface of the bottom protection insulation layer 152d and a portion of a side surface of the barrier layer 123d and a top cover part 154T covering a portion (i.e., the top surface of the protrusion PRT) of the top surface of the bottom protection insulation layer 152d.

The side cover part 154Sd may cover each of at least a portion of the side surface of the barrier layer 123d and at least a portion of the side surface of the bottom protection insulation layer 152d in the opening OP1d. In some embodiments, the side cover part 154Sd may include a first side portion 154Sd1 covering a portion of the side surface of the barrier layer 123d and a second side portion 154Sd2 covering a portion of the side surface of the bottom protection insulation layer 152d in the opening OP1d. The first side portion 154Sd1 and the second side portion 154Sd2 may be spaced apart from each other with a portion of the top surface of the barrier layer 123d therebetween.

In some embodiments, the first side portion 154Sd1 may be spaced apart from the connection pad 122. In some embodiments, a bottom surface of the second side portion 154Sd2 may contact a portion of the top surface of the barrier layer 123d. Each of an uppermost end of the first side portion 154Sd1 and the second side portion 154Sd2 may be disposed at the same level as the bottom surface of each of the sub-step STsd and the step STd, or may be disposed at a level which is lower than the bottom surface of each of the sub-step STsd and the step STd.

In a side surface of the barrier layer 123d in the opening OP1d, a lower portion may have a slope which is gentler than that of an upper portion. For example, the slope of the lower portion of the barrier layer 123d may be less than the slope of an upper portion of the barrier layer 123d. Also, for example, the slope of the barrier layer 123d may be concave up away from connection pad 122. The barrier layer 123d may include a tail portion 123TA adjacent to the bottom surface of the opening OP1d. The tail portion 123TA may be a portion, which is adjacent to the bottom surface of the opening OP1d, of a lower portion of the barrier layer 123d including a side surface having a slope which is gentler than that of a side surface of an upper portion of the barrier layer 123d.

The first side portion 154Sd1 may be disposed on the side surface of the upper portion of the barrier layer 123d and may not be disposed at the tail portion 123TA of the barrier layer 123d (i.e., a side surface of a lower portion of the barrier layer 123d).

The top cover part 154T may be disposed between the bottom protection insulation layer 152d and the top protection insulation layer 156. The top cover part 154T may be disposed between the top surface of the protrusion PRT of the bottom protection insulation layer 152d and a bottom surface of the top protection insulation layer 156. The top cover part 154T may cover only a portion of the top surface of the bottom protection insulation layer 152d (for example, the top surface (i.e., a relatively high top surface) of the protrusion PRT of the bottom protection insulation layer 152d). Additionally, the top cover part 154T may not cover a top surface of the bottom protection insulation 152d in the step STd region. The top cover part 154T may cover the whole bottom surface of the top protection insulation layer 156.

Figure 5:
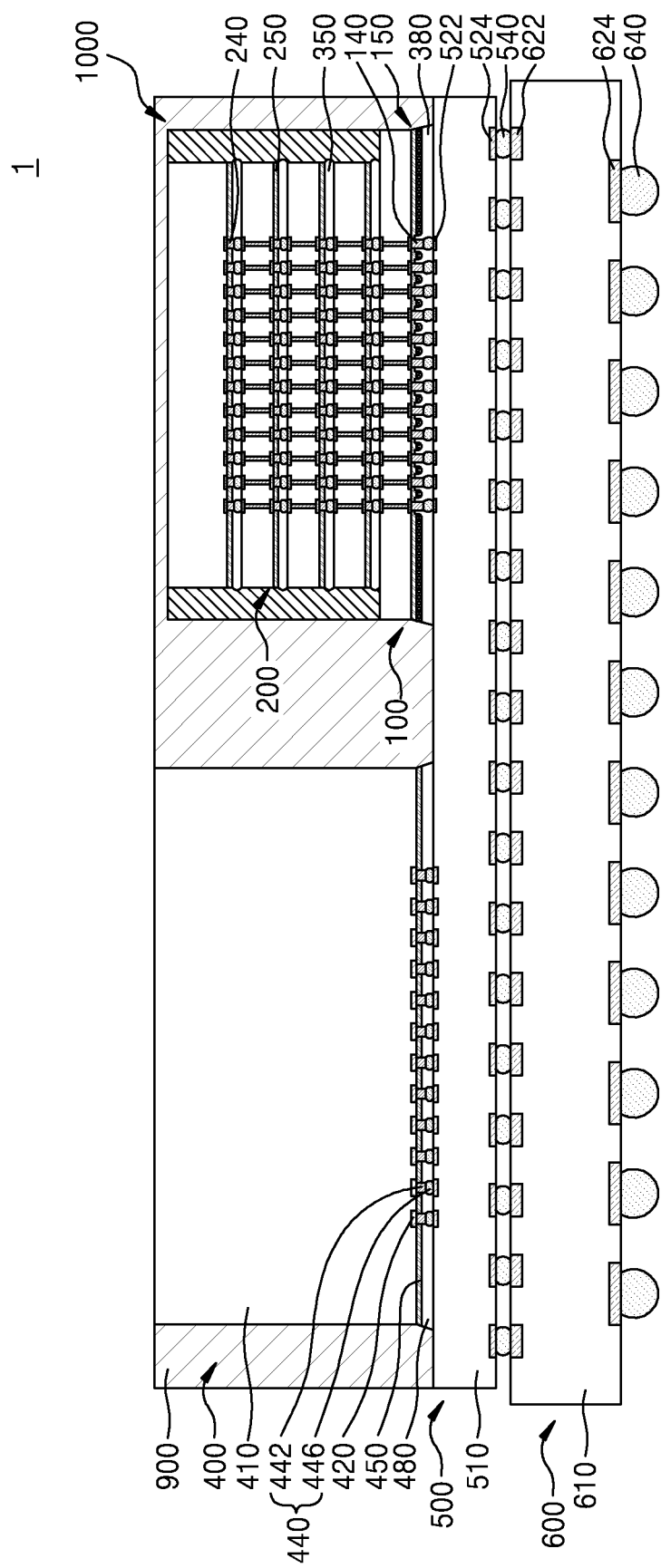
FIG. 5 is a cross-sectional view illustrating a system including a semiconductor package in accordance with disclosed embodiments.
Figure 6A:
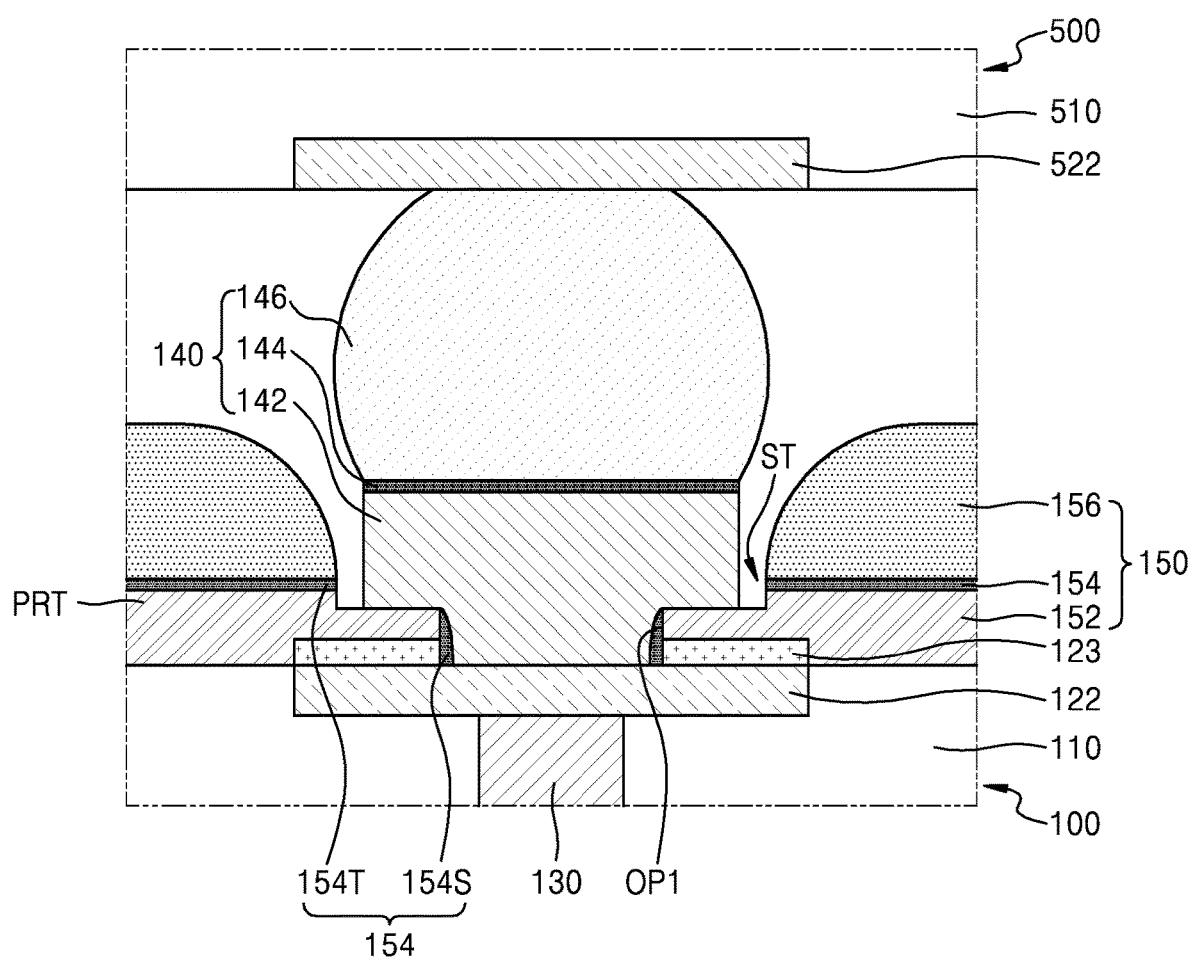
FIGS. 6A and 6B are enlarged cross-sectional views illustrating a first top connection pad and a second top connection pad each included in a semiconductor package of a system in accordance with disclosed embodiments.
Figure 6B:
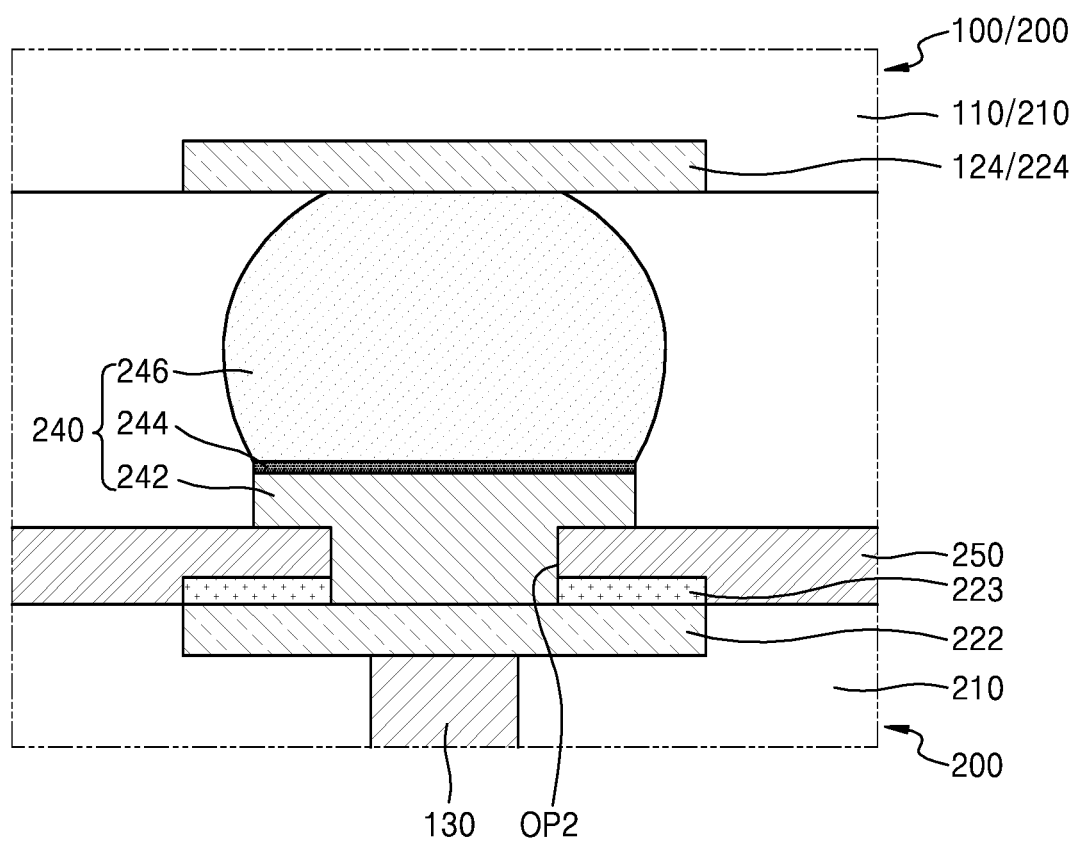

FIG. 5 is a cross-sectional view illustrating a system 1 including a semiconductor package in accordance with disclosed embodiments, and FIGS. 6A and 6B are enlarged cross-sectional views illustrating a first top connection pad and a second top connection pad each included in the semiconductor package of the system 1 in accordance with disclosed embodiments.

Referring to FIG. 5, the system 1 may include a main board 600 with an interposer 500 mounted thereon, a semiconductor package 1000 including a first semiconductor chip 100 and a plurality of second semiconductor chips 200 each attached on the interposer 500, and a third semiconductor chip 400. The semiconductor package 1000 has been described in detail with reference to FIG. 3, and thus, its repetitive description is omitted.

The third semiconductor chip 400 may include a third semiconductor substrate 410, a third top connection pad 420, a third protection insulation layer 450, and a third connection terminal 440. The third connection terminal 440 may include a third conductive pillar 442 on the third top connection pad 420 and a third conductive cap 246 on the third conductive pillar 442. In some embodiments, a third cover pillar the same as or similar to the cover pillar 244 illustrated in FIG. 6B may be disposed between the third conductive pillar 442 and the third conductive cap 446. The third semiconductor substrate 410, the third top connection pad 420, the third protection insulation layer 450, and the third connection terminal 440 are elements substantially similar to (or the same as) the first semiconductor substrate 110, the first top connection pad 122, the first protection insulation layer 150, and the first connection terminal 140 each illustrated in FIG. 3, respectively, or are elements substantially similar to (or the same as) the second semiconductor substrate 120, the second top connection pad 222, the second protection insulation layer 250, and the second internal connection terminal 240 each illustrated in FIG. 3, respectively, and thus, their detailed descriptions are omitted.

The third semiconductor chip 400 may be, for example, a CPU chip, a GPU chip, or an AP chip.

The interposer 500 may include a base layer 510, a first top pad 522 disposed on a top surface of the base layer 510, and a first bottom pad 524 disposed on a bottom surface of the base layer 510.

The base layer 510 may include semiconductor, glass, ceramic, or plastic. For example, the base layer 510 may include silicon. A wiring layer connected to the first top pad 522 and/or the first bottom pad 524 may be disposed on the top surface and/or the bottom surface of the base layer 510, and an internal through electrode electrically connecting the first top pad 522 to the first bottom pad 524 may be formed in the base layer 510. The first connection terminal 140 electrically connecting the semiconductor package 1000 to the interposer 500 and the third connection terminal 440 electrically connecting the third semiconductor chip 400 to the interposer 500 may be connected to the first top pad 522.

A first underfill layer 380 may be disposed between the semiconductor package 1000 and the interposer 500, and a second underfill layer 480 may be disposed between the third semiconductor chip 400 and the interposer 500. The first underfill layer 380 and the second underfill layer 480 may respectively surround the first connection terminal 140 and the third connection terminal 440. The system 1 may further include a package molding layer 900 surrounding side surfaces of semiconductor package 1000 and the third semiconductor chip 400 on the interposer 500. The package molding layer 900 may include, for example, an EMC.

A system connection terminal 540 may be attached on the first bottom pad 524. The system connection terminal 540 may electrically connect the interposer 500 to the main board 600.

The main board 600 may include a base board layer 610, a second top pad 622 disposed on a top surface of the base board layer 610, and a second bottom pad 624 disposed on a bottom surface of the base board layer 610. In some embodiments, the main board 60 may be a printed circuit board (PCB). For example, the main board 600 may be a multi-layer PCB. The base board layer 610 may include at least one material selected from among a phenol resin, an epoxy resin, and polyimide.

A solder resist layer (not shown) exposing the second top pad 622 and the second bottom pad 624 may be formed on each of the top surface and the bottom surface of the base board layer 610. The system connection terminal 540 may be connected to the second top pad 622, and an external connection terminal 640 may be connected to the second bottom pad 624. The system connection terminal 540 may electrically connect the first bottom pad 524 to the second top pad 622. The external connection terminal 640 connected to the second bottom pad 624 may connect the system 1 to the outside.

In some embodiments, the system 1 may not include the main board 600 (and its external connection terminal 640), and the system connection terminal 540 of the interposer 500 may perform a similar function as the external connection terminal 640 in its absence.

In some embodiments, in a case where the system 1 is used as a portion of a larger system, the system 1 may be referred to as a main semiconductor package, and the semiconductor package 1000 may be referred to as a sub-semiconductor package.

Referring to FIG. 6A, the first connection terminal 140 may electrically connect the first top connection pad 122 to the first top pad 522. The first connection terminal 140 may include a first base pillar 142 (a first conductive pillar) on the first top connection pad 122 and a first conductive cap 146 on the first base pillar 142. In some embodiments, a first cover pillar 144 may be disposed between the first base pillar 142 and the first conductive cap 146.

The first base pillar 142 may include, for example, copper, and the first cover pillar 144 may include, for example, at least one of nickel, copper, palladium, platinum, and gold. In some embodiments, the first cover pillar 144 may include nickel. In some other embodiments, the first cover pillar 144 may have a multi-layer structure which includes a first layer including nickel and a second layer covering the first layer and including copper.

The first conductive cap 146 may contact the first top pad 522 of the interposer 500 to electrically connect the first semiconductor chip 100 to the interposer 500. The first conductive cap 146 may include, for example, at least one of tin (Sn), indium (In), bismuth (Bi), antimony (Sb), copper (Cu), silver (Ag), gold (Au), zinc (Zn), and lead (Pb).

The first base pillar 142 may be formed to fill a first opening OP1 and to protrude with respect to top surfaces of a bottom protection insulation layer 152 and a cover insulation layer 154. In FIG. 6A, a top surface of the first base pillar 142 is illustrated as being disposed at a level which is higher than a top surface of the cover insulation layer 154 and is lower than a top surface of a top protection insulation layer 156, but is not limited thereto. In some embodiments, the top surface of the first base pillar 142 may be disposed at a level which is higher than the top surface of the top protection insulation layer 156.

The first base pillar 142 may be formed to be spaced apart from a protrusion PRT of the bottom protection insulation layer 152. A side surface of a lower portion of the first base pillar 142 may contact a side cover part 154S. The side cover part 154S may be disposed between the first base pillar 142 and each of the bottom protection insulation layer 152 and the first barrier layer 123. The first base pillar 142 may be spaced apart from a top cover part 154T. For example, there may be a gap or opening between the first base pillar 142 and the top cover part 154T.

Referring to FIG. 6B, a second internal connection terminal 240 may electrically connect a second top connection pad 222 to a first bottom connection pad 124, or may electrically connect the second top connection pad 222 to a second bottom connection pad 224. The second internal connection terminal 240 may include a second base pillar 242 on the second top connection pad 222 and a second conductive cap 246 on the second base pillar 242. In some embodiments, a second cover pillar 244 may be disposed between the second base pillar 242 and the second conductive cap 246.

The second conductive cap 246 may contact the first bottom connection pad 124 of the first semiconductor chip 100 or a second bottom connection pad 224 of another second semiconductor chip 200 (a different second semiconductor chip 200 of a plurality of second semiconductor chips 200) to electrically connect the second semiconductor chip 200 to the first semiconductor chip 100 or to electrically connect different second semiconductor chips 200 of a plurality of second semiconductor chips 200.

The second base pillar 242 may be formed to fill a second opening OP2 and to protrude with respect to a top surface of a second protection insulation layer 250. For example the second base pillar 242 may be formed to completely fill the second opening OP2. The second protection insulation layer 250 may include the same material as that of the bottom protection insulation layer 152 illustrated in FIG. 6A. A side surface of a lower portion of the second base pillar 242 may contact the second protection insulation layer 250.

The second protection insulation layer 250 may be formed in a shape similar to that of an intermediate resultant material of the bottom protection insulation layer 152 illustrated in FIG. 2B by using a method of manufacturing the bottom protection insulation layer 152 illustrated in FIGS. 2A and 2B. That is, unlike the first protection insulation layer 150 illustrated in FIG. 6A, the second protection insulation layer 250 may not include elements corresponding to the cover insulation layer 154 and the top protection insulation layer 156 and may not include a step ST and a protrusion PRT each included in the bottom protection insulation layer 152.

FIGS. 7A to 7D are enlarged cross-sectional views illustrating a first top connection pad included in a semiconductor package of a system in accordance with disclosed embodiments. Except for that the protection insulation layers 150a to 150d and the barrier layers 123a to 123d respectively illustrated in FIGS. 4A to 4D are provided instead of the first protection insulation layer 150 and the first barrier layer 123 of FIG. 6A, FIGS. 7A to 7D are substantially the same as FIGS. 4A to 4D, respectively, and thus, descriptions which are the same as or similar to descriptions of FIGS. 4A to 4D and 6A may be omitted.

Figure 7A:
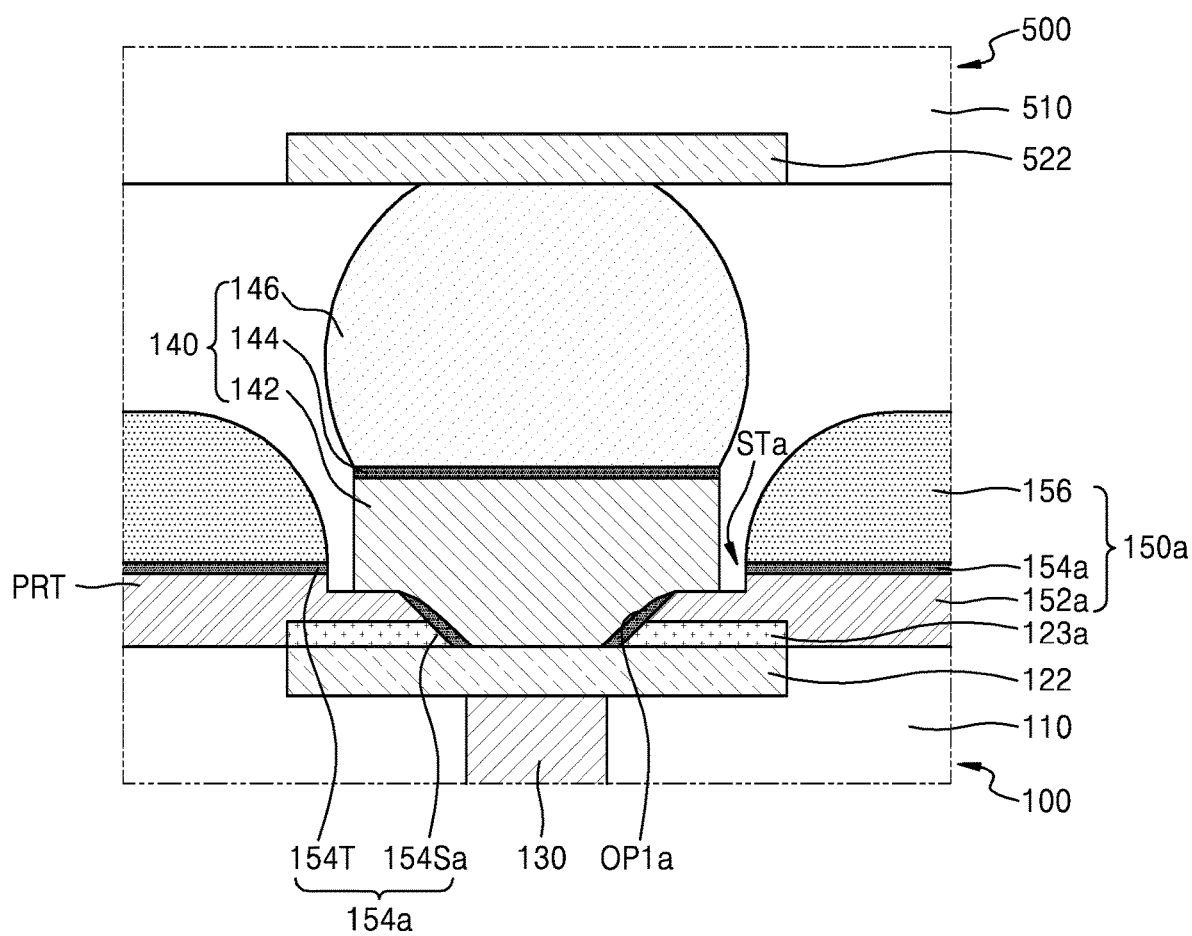
FIGS. 7A to 7D are enlarged cross-sectional views illustrating a first top connection pad included in a semiconductor package of a system in accordance with disclosed embodiments.

Referring to FIG. 7A, a first base pillar 142 may be formed apart from a protrusion PRT of a bottom protection insulation layer 152a. A side surface of a lower portion of the first base pillar 142 may contact a side cover part 154Sa. The side cover part 154Sa may be disposed between the first base pillar 142 and each of the bottom protection insulation layer 152a and a barrier layer 123a.

Figure 7B:
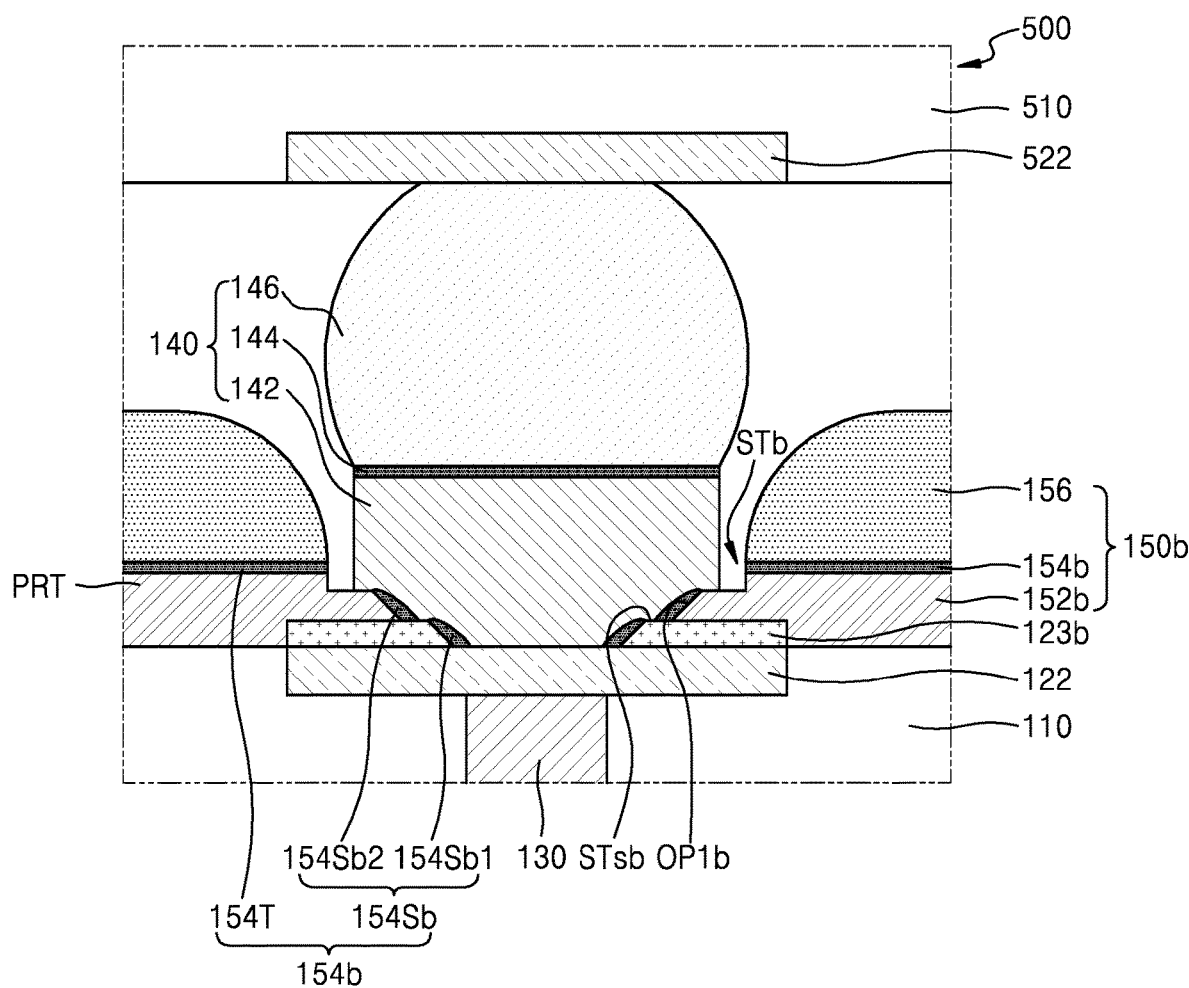

Referring to FIG. 7B, a first base pillar 142 may be formed to be spaced apart from a protrusion PRT of a bottom protection insulation layer 152b. For example, there may be a gap between the first base pillar 142 and the bottom protection insulation layer 152b. A side surface of a lower portion of the first base pillar 142 may contact a first side portion 154Sb1 and a second side portion 154Sb2, which are disposed apart from each other. The first side portion 154Sb1 may be disposed between the barrier layer 123b and the first base pillar 142, and the second side portion 154Sb2 may be disposed between the bottom protection insulation layer 152b and the first base pillar 142.

Figure 7C:
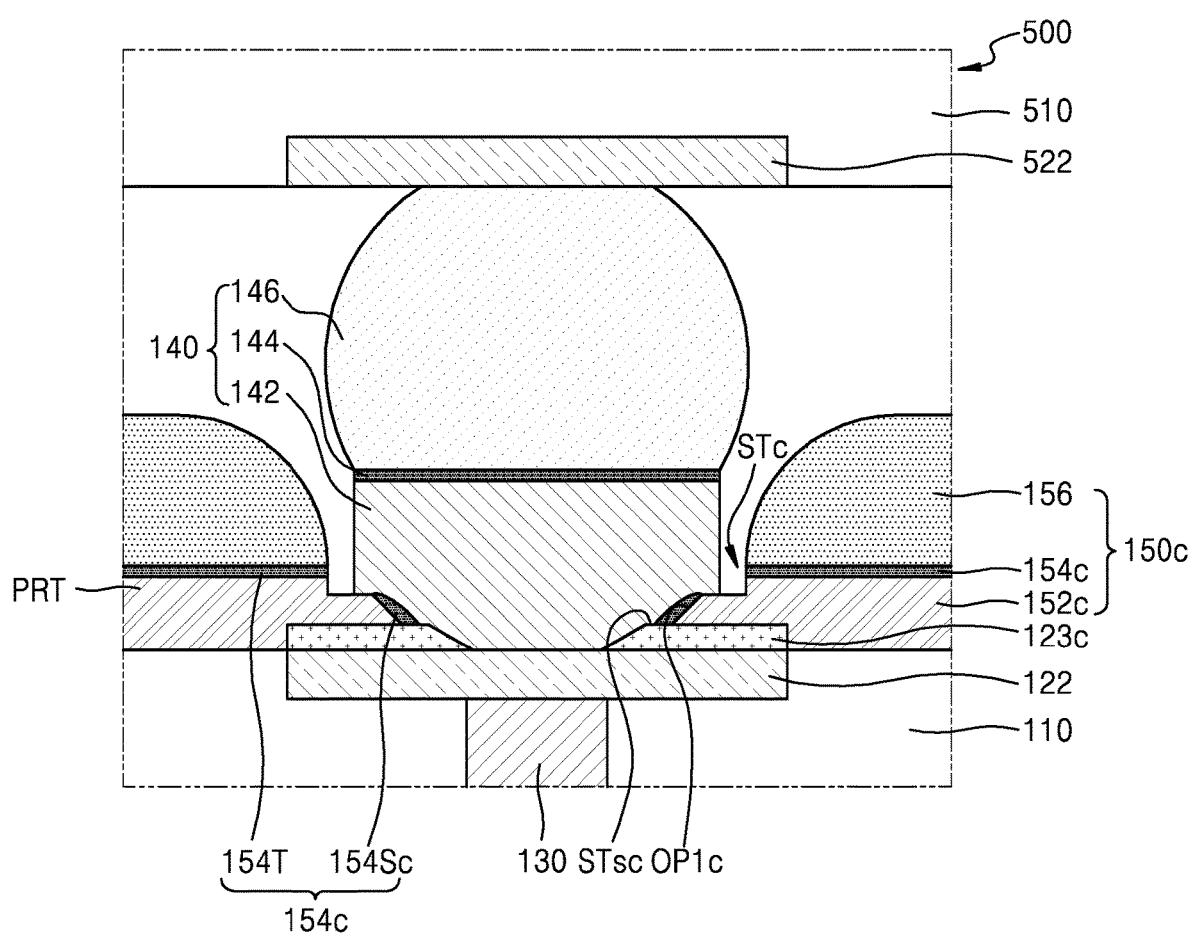

Referring to FIG. 7C, a first base pillar 142 may be formed to be spaced apart from a protrusion PRT of a bottom protection insulation layer 152c. For example, there may be a gap between the first base pillar 142 and the bottom protection insulation layer 152c. A side surface of a lowermost portion of the first base pillar 142 may contact a barrier layer 123c, and a side surface of a lower portion (i.e., a side surface of an upper portion instead of a side surface of a lowermost portion) of the first base pillar 142, which does not contact the barrier layer 123c, may contact a side cover part 154Sc. The side cover part 154Sc may be disposed between the bottom protection insulation layer 152c, the barrier layer 123c, and the first base pillar 142.

Figure 7D:
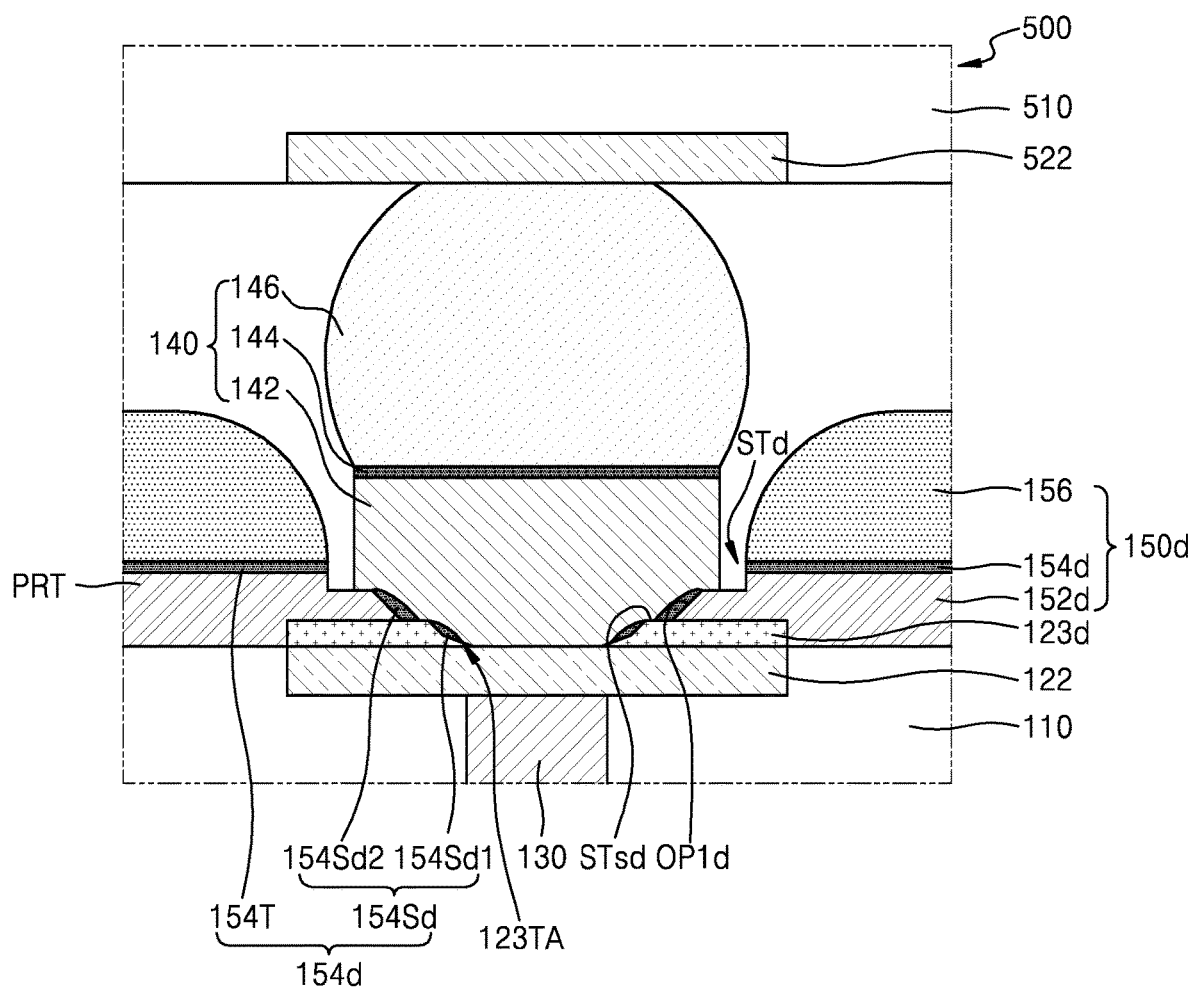

Referring to FIG. 7D, a first base pillar 142 may be formed apart from a protrusion PRT of a bottom protection insulation layer 152d. A side surface of a lower portion of the first base pillar 142 may contact a first side portion 154Sd1 and a second side portion 154Sd2, which are disposed apart from each other. The first side portion 154Sd1 may be disposed between the barrier layer 123d and the first base pillar 142, and the second side portion 154Sd2 may be disposed between the bottom protection insulation layer 152d, the barrier layer 123d, and the first base pillar 142.

The side surface of the lower portion of the first base pillar 142 may contact a tail portion 123TA of the barrier layer 123d, the first side portion 154Sd1, a portion of a top surface of the barrier layer 123d, and the second side portion 154Sd2 sequentially from a lowermost portion of the first base pillar 142.

FIGS. 8A to 8D are enlarged cross-sectional views illustrating a second top connection pad included in a semiconductor package of a system in accordance with disclosed embodiments. Except for that the second protection insulation layers 250a to 250d and barrier layers 223a to 223d are provided instead of the second protection insulation layer 250 and the second barrier layer 223 of FIG. 6B. Each of FIGS. 8A to 8D is substantially the same as FIG. 6B, and thus, description which is the same as or similar to the description of FIG. 6B may be omitted.

Figure 8A:
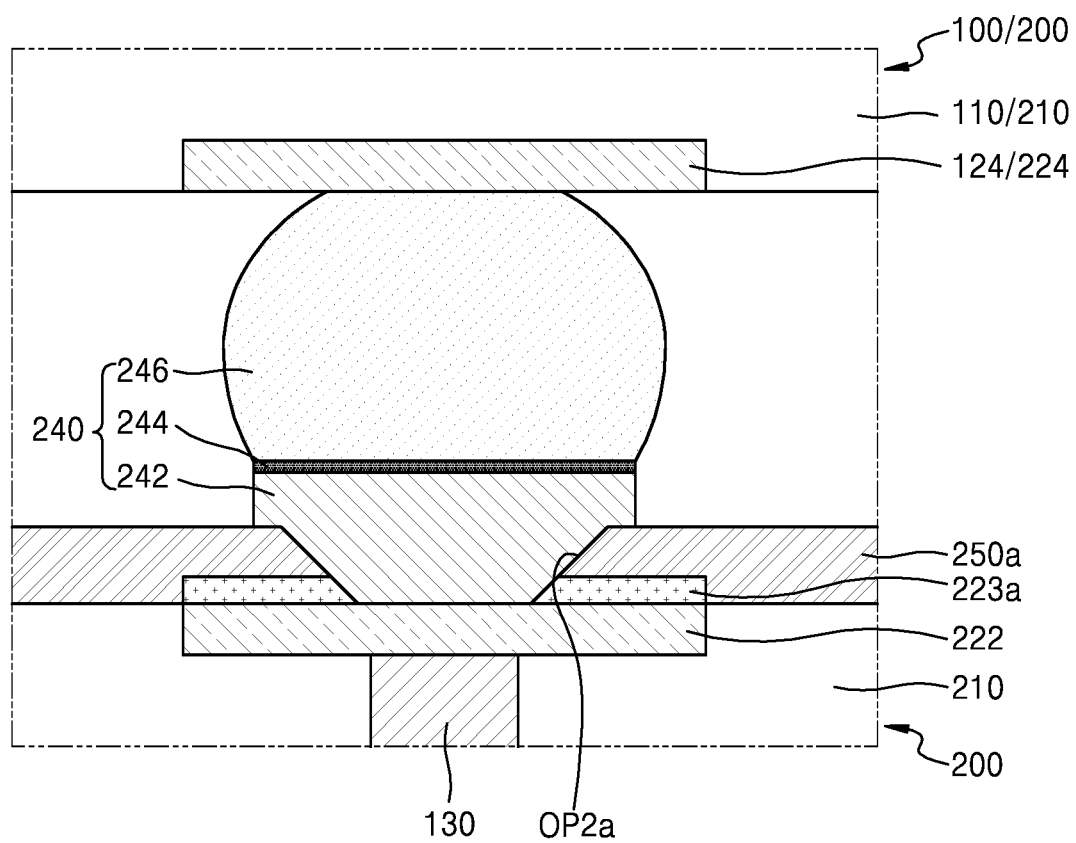
FIGS. 8A to 8D are enlarged cross-sectional views illustrating a second top connection pad included in a semiconductor package of a system in accordance with disclosed embodiments.

Referring to FIG. 8A, a second protection insulation layer 250a may include a second opening OP2a which exposes at least a portion of a second top connection pad 222. A second base pillar 242 may be formed to fill the second opening OP2a and to protrude with respect to a top surface of the second protection insulation layer 250a. The second opening OP2a may have a horizontal width, which increases in a distancing direction (vertical direction) from a bottom surface thereof to an upper portion thereof. The second protection insulation layer 250a and the second barrier layer 223a may have a horizontal width, which decreases in a distancing direction (vertical direction) from the bottom surface of the second opening OP2a to the upper portion of the second opening OP2a. That is, side surfaces of the second protection insulation layer 250a and the second barrier layer 223a in the second opening OP2a may be inclined away from the opening OP2a and may extend upward. A side surface of a lower portion of the second base pillar 242 may contact the side surfaces of the second protection insulation layer 250a and the second barrier layer 223a.

Figure 8B:
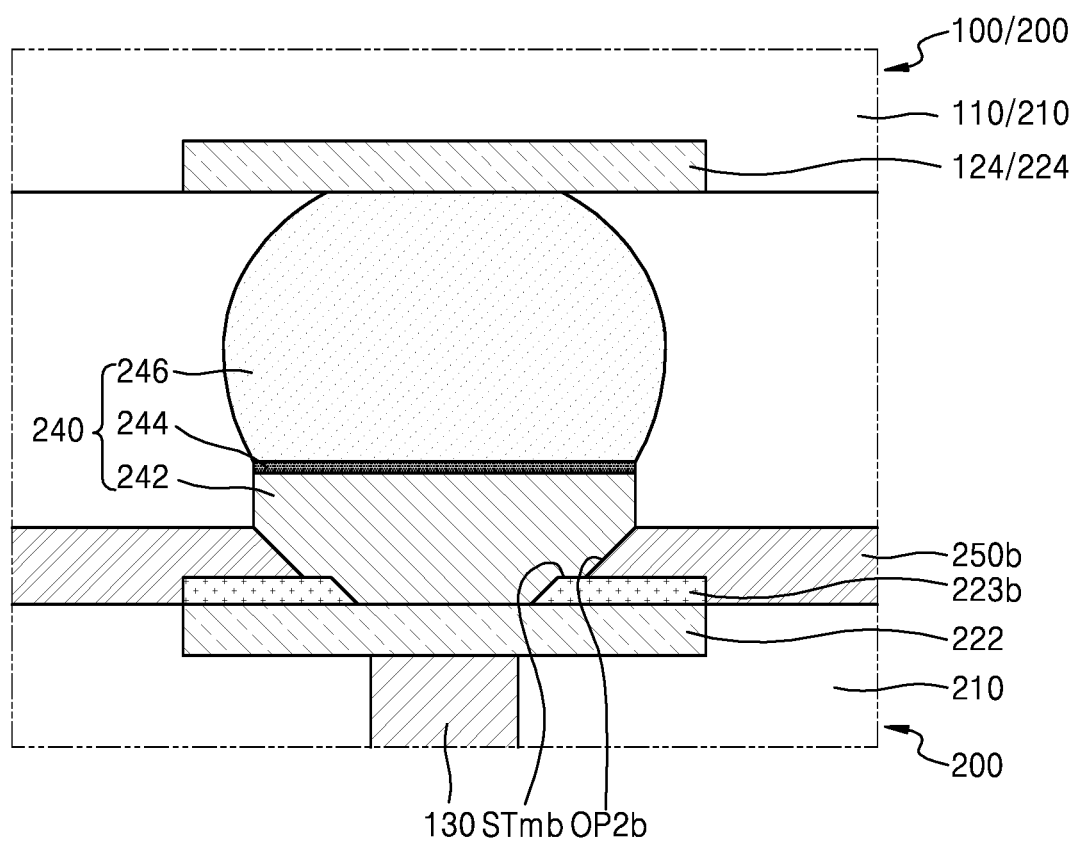

Referring to FIG. 8B, a second protection insulation layer 250b may include a second opening OP2b which exposes at least a portion of a second top connection pad 222. A second base pillar 242 may be formed to fill the second opening OP2b and to protrude with respect to a top surface of the second protection insulation layer 250b. The second opening OP2b may have a horizontal width, which increases in a distancing direction (vertical direction) from a bottom surface thereof to an upper portion thereof. The second protection insulation layer 250b and the second barrier layer 223b may have a horizontal width which decreases in a distancing direction (vertical direction) from the bottom surface of the second opening OP2b to the upper portion of the second opening OP2b. That is, side surfaces of the second protection insulation layer 250b and the second barrier layer 223b in the second opening OP2b may be inclined away from the second opening OP2b and may extend upward. A side surface of a lower portion of the second base pillar 242 may contact the side surfaces of the second protection insulation layer 250b and the second barrier layer 223b.

A middle step STmb may be formed between the second protection insulation layer 250b and the second barrier layer 223b in the second opening OP2b. The middle step STmb may be defined by a side surface of the second protection insulation layer 250b and a top surface of the second barrier layer 223b in the second opening OP2b. A width of a portion of the second opening OP2b at a level at which the second barrier layer 223b is disposed may have a value which is less than that of a width of a portion of the second opening OP2b at a level at which the second protection insulation layer 250b is disposed.

Figure 8C:
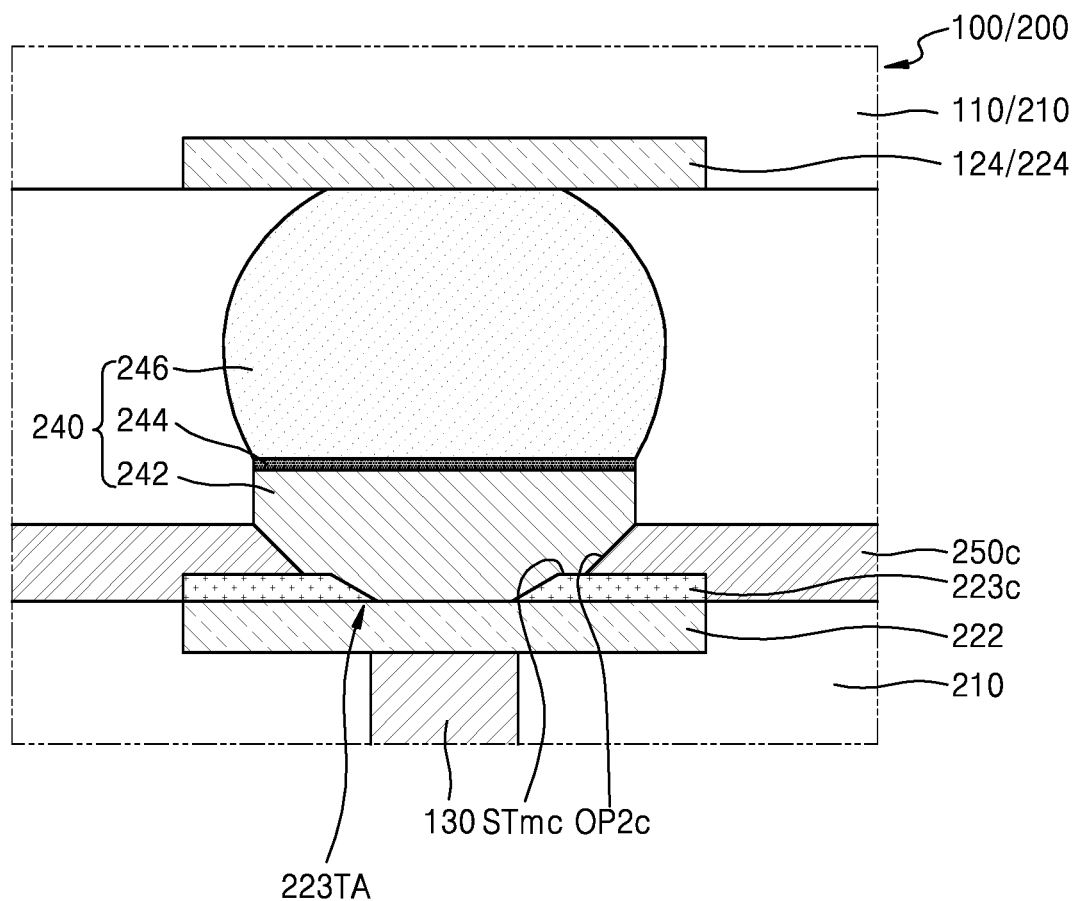

Referring to FIG. 8C, a second protection insulation layer 250c may include a second opening OP2c which exposes at least a portion of a second top connection pad 222. A second base pillar 242 may be formed to fill the second opening OP2c and to protrude with respect to a top surface of the second protection insulation layer 250c. The second opening OP2c may have a horizontal width, which increases in a distancing direction (vertical direction) from a bottom surface thereof to an upper portion thereof. The second protection insulation layer 250c and the second barrier layer 223c may have a horizontal width, which decreases in a distancing direction from the bottom surface of the second opening OP2c to the upper portion of the second opening OP2c. That is, side surfaces of the second protection insulation layer 250c and the second barrier layer 223c in the second opening OP2c may be inclined away from the second opening OP2c and may extend upward.

A side surface of the second barrier layer 223c adjacent the second opening OP2c may be inclined less than a side surface of the second protection insulation layer 250c facing the second protection insulation layer 250c. That is, an acute angle between the top surface of the second barrier layer 223c and the side surface of the second protection insulation layer 250c may be greater than an acute angle between a bottom surface of the second barrier layer 223c and the side surface of the second barrier layer 223c. A side surface of a lower portion of the second base pillar 242 may contact the side surfaces of the second protection insulation layer 250c and the second barrier layer 223c.

A middle step STmc may be formed between the second protection insulation layer 250c and the second barrier layer 223c in the second opening OP2c. The middle step STmc may be defined by a side surface of the second protection insulation layer 250c and a top surface of the second barrier layer 223c. A width of a portion of the second opening OP2c at a level at which the second barrier layer 223c is disposed may have a value which is less than that of a width of a portion of the second opening OP2c at a level there above.

Figure 8D:
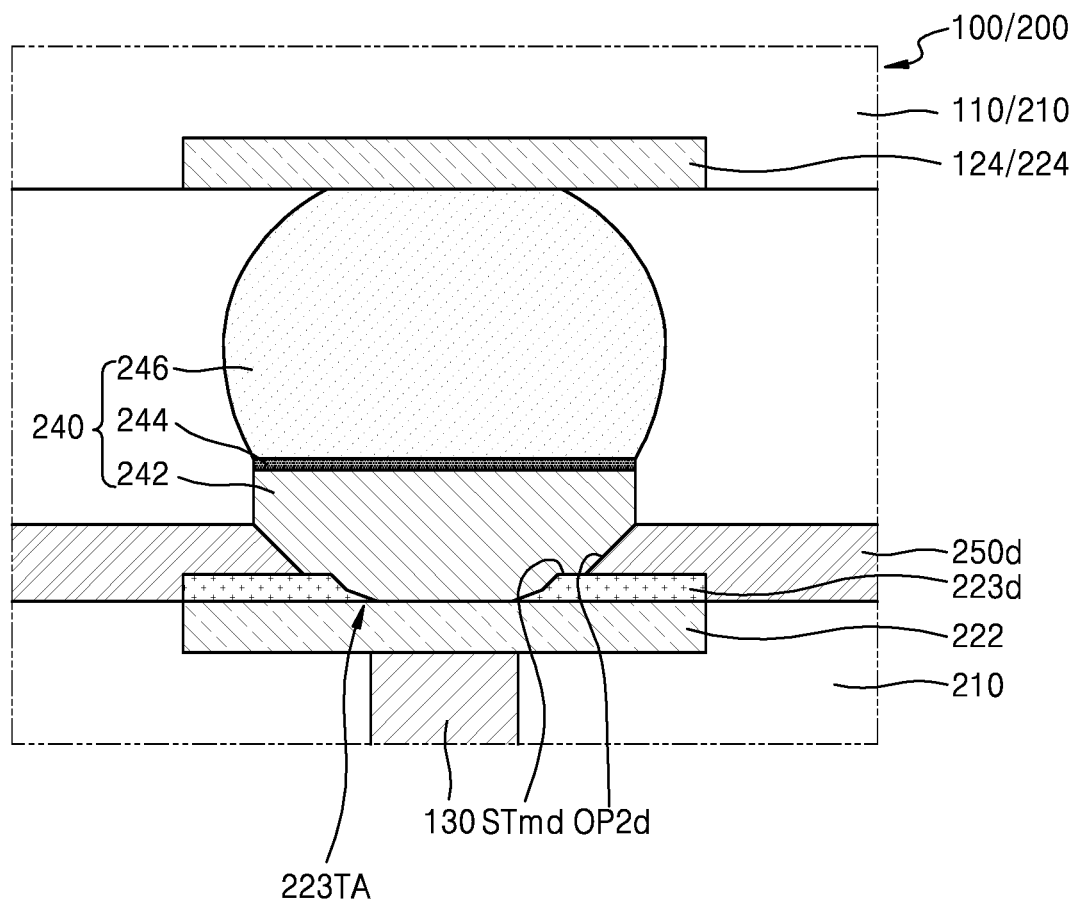

Referring to FIG. 8D, a second protection insulation layer 250d may include a second opening OP2d which exposes at least a portion of a second top connection pad 222. A second base pillar 242 may be formed to fill the second opening OP2d and to protrude with respect to a top surface of the second protection insulation layer 250d. The second opening OP2d may have a horizontal width, which increases in a distancing direction (vertical direction) from a bottom surface thereof to an upper portion thereof. The second protection insulation layer 250d and the second barrier layer 223d may have a horizontal width, which decreases in a distancing direction (vertical direction) from the bottom surface of the second opening OP2d to the upper portion of the second opening OP2d. That is, side surfaces of the second protection insulation layer 250d and the second barrier layer 223d in the second opening OP2d may be inclined away from the opening and may extend upward.

A side surface of the second barrier layer 223d adjacent the second opening OP2d may be inclined differently than a side surface of the second protection insulation layer 250d adjacent the second protection insulation layer 250d. That is, the slope of the side surface of the second barrier layer 223d may vary. For example, the slope of the side surface of the second barrier layer 223d at a lower portion nearest connection terminal 222 may be less than the slope of the side surface of the second barrier layer 223d at an upper portion farther from connection terminal 222. The angle of inclination of the side surface of the second barrier layer 223d at an upper portion farther from connection terminal 222 may be greater than an angle of inclination between a bottom surface of the second barrier layer 223d and the side surface of the second barrier layer 223d. A side surface of a lower portion of the second base pillar 242 may contact the side surfaces of the second protection insulation layer 250d and the second barrier layer 223d.

A side surface of the second barrier layer 223d adjacent a lower portion of the second opening OP2d, may have a slope which is gentler than that of an upper portion. The second barrier layer 223d may include a tail portion 223TA adjacent to the bottom surface of the second opening OP2d. The tail portion 223TA may be a portion, which is adjacent to the lower portion of the second barrier layer 223d near the connection terminal 222 and may include a side surface having a slope which is gentler than that of a side surface of an upper portion of the second barrier layer 223d.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor chip, the method comprising:
preparing a semiconductor substrate;
forming a top connection pad in a top surface; and
forming a protection insulation layer having an opening therein, the protection insulation layer not covering at least a portion of the top connection pad, on the semiconductor substrate,
wherein the protection insulation layer includes:
a bottom protection insulation layer,
a cover insulation layer comprising a side cover part that covers at least a portion of a side surface of the bottom protection insulation layer and a top cover part disposed apart from the side cover part to cover at least a portion of a top surface of the bottom protection insulation layer, and
a top protection insulation layer formed of a photosensitive polyimide, and disposed on the top cover part.

2. The method as claimed in claim 1, wherein the bottom protection insulation layer further comprises a protrusion and a step, and
wherein the step defines an upper portion of the protrusion adjacent to the opening.

3. The method as claimed in claim 2, wherein the top cover part covers a top surface of the protrusion, and the top protection insulation layer is disposed on the protrusion.

4. The method as claimed in claim 2, wherein the side cover part covers at least a portion of a side surface of the bottom protection insulation layer, the portion of the side surface being lower in elevation than a bottom surface of the step.

5. The method as claimed in claim 2, further comprising:
forming a barrier layer on the top connection pad,
wherein at least a portion of the barrier layer is disposed between the top connection pad and the bottom protection insulation layer, and
wherein the opening passes through the bottom protection insulation layer and the barrier layer.

6. The method as claimed in claim 5, wherein the side cover part is configured to cover all of the side surface of the barrier layer and at least a portion of a side surface of the bottom protection insulation layer between the step and a top surface of the top connection pad.

7. The method as claimed in claim 5, wherein the side cover part comprises:
a first side portion that covers a portion of a side surface of the barrier layer; and
a second side portion that covers a portion of a side surface of the bottom protection insulation layer, and
wherein the first side portion and the second side portion are apart from each other.

8. The method as claimed in claim 7, wherein the first side portion is apart from the top connection pad.

9. The method as claimed in claim 5, wherein a side surface of the bottom protection insulation layer and a top surface of the barrier layer are defined a sub-step defined in the opening.

10. The method as claimed in claim 5, wherein the side cover part is apart from the top connection pad.

11. The method as claimed in claim 5, wherein the side cover part covers at least a portion of a side surface of the bottom protection insulation layer and does not cover a side surface of the barrier layer.

12. A method of manufacturing a semiconductor chip, the method comprising:
preparing a semiconductor substrate;
forming a top connection pad in a top surface; and
forming a bottom protection insulation layer on the semiconductor substrate and the top connection pad;
forming an opening exposing at least a portion of the top connection pad by removing a portion of the bottom protection insulation layer;
forming a cover insulation layer on the bottom protection insulation layer and the top connection pad;
forming a top protection insulation layer covering a portion of the cover insulation layer;
removing a portion of the cover insulation layer to form a side cover part that covers at least a portion of a side surface of the bottom protection insulation layer and a top cover part disposed apart from the side cover part to cover at least a portion of a top surface of the bottom protection insulation layer by using the top protection insulation layer as an etch mask; and
forming a connection terminal on the top surface of the top connection pad.

13. The method as claimed in claim 12, wherein the connection terminal includes:
a base pillar on the top connection pad,
a conductive cap on the base pillar, and
a cover pillar between the base pillar and the conductive cap.

14. The method as claimed in claim 13, wherein the base pillar fills the opening and protrudes with respect to top surfaces of the bottom protection insulation layer and the cover insulation layer.

15. The method as claimed in claim 13, wherein:
a side surface of a lower portion of the base pillar contacts the side cover part, and
the base pillar is spaced apart from the top cover part.

16. The method as claimed in claim 13, wherein a top surface of the base pillar is disposed at a level which is higher than a top surface of the cover insulation layer.

17. A method of manufacturing a semiconductor chip, the method comprising:
preparing a semiconductor substrate;
forming a top connection pad in a top surface;
forming a barrier layer on the top connection pad, forming a bottom protection insulation layer on the semiconductor substrate and the barrier layer;
forming an opening exposing at least a portion of the top connection pad by removing a portion of the bottom protection insulation layer and a portion of the barrier layer;
forming a cover insulation layer on a side surface of the bottom protection insulation layer and a side surface of the barrier layer and a portion of the top surface of the top connection pad in the opening, and a top surface of the bottom protection insulation layer;
forming a top protection insulation layer covering a portion of the cover insulation layer;
removing a portion of the cover insulation layer to form a side cover part that covers at least a portion of a side surface of the bottom protection insulation layer and a top cover part disposed apart from the side cover part to cover at least a portion of a top surface of the bottom protection insulation layer by using the top protection insulation layer as an etch mask; and
forming a connection terminal on the top surface of the top connection pad.

18. The method as claimed in claim 17, wherein further comprising:
removing a portion of an upper portion of the bottom protection insulation layer to form a protrusion of the bottom protection insulation layer and a step of the bottom protection insulation layer, and wherein the step defines an upper portion of the protrusion adjacent to the opening.

19. The method as claimed in claim 18, wherein the top protection insulation layer is disposed on the protrusion, and the top cover part is disposed between the protrusion and the top protection insulation layer.

20. The method as claimed in claim 17, wherein the bottom protection insulation layer, and the cover insulation layer each comprise an inorganic material, and the top protection insulation layer comprises a polymer.

* * * * *